United States Patent
Ishihara et al.

(10) Patent No.: US 11,145,916 B2
(45) Date of Patent: Oct. 12, 2021

(54) POWER SAVING STANDBY STATE MAINTAINING DEVICE FOR A VEHICLE INFORMATION APPARATUS

(71) Applicant: MITSUBISHI ELECTRIC CORPORATION, Tokyo (JP)

(72) Inventors: Masamitsu Ishihara, Tokyo (JP); Hisanori Yamada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 208 days.

(21) Appl. No.: 16/464,243

(22) PCT Filed: Dec. 28, 2016

(86) PCT No.: PCT/JP2016/089098
§ 371 (c)(1),
(2) Date: May 24, 2019

(87) PCT Pub. No.: WO2018/123018
PCT Pub. Date: Jul. 5, 2018

(65) Prior Publication Data
US 2019/0315247 A1     Oct. 17, 2019

(51) Int. Cl.
*H01M 10/613*     (2014.01)
*G01R 31/392*     (2019.01)
(Continued)

(52) U.S. Cl.
CPC .......... *H01M 10/613* (2015.04); *B60L 58/33* (2019.02); *G01R 31/382* (2019.01);
(Continued)

(58) Field of Classification Search
CPC .......... B60L 58/33; B60L 50/50; B60L 58/12; G01R 31/382; G01R 31/392;
(Continued)

(56) References Cited

FOREIGN PATENT DOCUMENTS

JP         5-199668 A       8/1993
JP      2004015866 A   *   1/2004   .............. B60L 50/61
(Continued)

OTHER PUBLICATIONS

International Search Report for PCT/JP2016/089096 (PCT/ISA/210) dated Mar. 7, 2017.
International Search Report for PCT/JP2016/089098 (PCT/ISA/210) dated Feb. 21, 2017.
U.S. Office Action for U.S. Appl. No. 16/464,233, dated Sep. 29, 2020.
(Continued)

*Primary Examiner* — Jay Patidar
(74) *Attorney, Agent, or Firm* — Birch, Stewart, Kolasch & Birch, LLP

(57) ABSTRACT

A standby state maintaining device includes a secondary battery disposed separately from a vehicle battery, a temperature sensor for the secondary battery, a charge storage member that supports charge and discharge in a temperature outside a reference range, and a controller having a first operation mode of, in a state in which a starting switch of a vehicle is off, maintaining a power saving standby state of a vehicle-mounted information apparatus by using the secondary battery when a detected value provided by the temperature sensor is within the reference range, and maintaining the power saving standby state by using the charge storage member when the detected value is outside the reference range.

17 Claims, 14 Drawing Sheets

(51) Int. Cl.
*G01R 31/382* (2019.01)
*B60L 58/33* (2019.01)
*G06F 1/3212* (2019.01)
*H02J 7/00* (2006.01)

(52) U.S. Cl.
CPC ......... *G01R 31/392* (2019.01); *G06F 1/3212* (2013.01); *H02J 7/007192* (2020.01)

(58) Field of Classification Search
CPC ......... G06F 1/3212; G06F 1/263; G06F 1/28; H01M 10/613; H01M 10/0525; H01M 10/345; H01M 10/486; H01M 10/625; H01M 10/6561; H01M 16/00; H01M 2220/20; H02J 2310/40; H02J 7/00; H02J 7/0063; H02J 7/007192; H02J 7/007194; H02J 7/04; H02J 9/005; Y02D 10/00; Y02E 60/10
See application file for complete search history.

(56) References Cited

FOREIGN PATENT DOCUMENTS

| | | | |
|---|---|---|---|
| JP | 2004-94732 A | | 3/2004 |
| JP | 2004161263 A | * | 6/2004 |
| JP | 2004171796 A | * | 6/2004 |
| JP | 2006187160 A | * | 7/2006 |
| JP | 4121793 B2 | * | 7/2008 |
| JP | 2011182526 A | * | 9/2011 |
| JP | 2012-222938 A | | 11/2012 |
| JP | 2013-225968 A | | 10/2013 |
| JP | 2014-222578 A | | 11/2014 |

OTHER PUBLICATIONS

Office Action issued in corresponding Japanese Application No. 2018-558607 dated Mar. 10, 2020.

* cited by examiner

POWER SAVING STANDBY STATE MAINTAINING DEVICE FOR A VEHICLE INFORMATION APPARATUS

TECHNICAL FIELD

The present invention relates to a standby state maintaining device for a vehicle-mounted information apparatus.

BACKGROUND ART

Conventionally, a vehicle-mounted information apparatus that performs the functions of car navigation, display audio, or the like is mounted in a vehicle. Usually, a vehicle-mounted information apparatus mounted in a gasoline automobile operates with power supplied from a battery for startup mounted in the automobile. Further, the vehicle-mounted information apparatus mounted in an electric automobile operates with power supplied from an auxiliary battery mounted in the automobile (for example, refer to Patent Literature 1).

CITATION LIST

Patent Literature

Patent Literature 1: Japanese Unexamined Patent Application Publication No. 2013-225968

SUMMARY OF INVENTION

Technical Problem

Conventionally, in an information apparatus other than the vehicle-mounted information apparatus, a standby state (referred to as a "power saving standby state" hereafter) in which the power consumption is less than that in a state in which the information apparatus is operating (referred to as an "operating state" hereafter), and in which the time required for restart is shorter than that in a state in which the power supply of the information apparatus is completely switched off (referred to as a "shutdown state" hereafter) is adopted. Concretely, for example, a power saving standby state corresponding to the status of S1, S2, or S3 in ACPI (Advanced Configuration and Power Interface) is adopted. This power saving standby state is one in which the information apparatus stands by in a state in which data in a volatile memory is held, by maintaining the passage of a current to the memory, and in which a current (so-called "dark current") is continuously consumed during standby. This power saving standby state is called "standby mode", "sleep mode", "suspend mode", or the like.

In an vehicle-mounted information apparatus, it is difficult to adopt a power saving standby state from the viewpoint of avoiding a decrease in the charge capacity of either a battery for startup or an auxiliary battery (generically referred to as a "vehicle battery" hereafter) due to a dark current in a state in which an ignition switch or a starter switch (generically referred to as a "starting switch" hereafter) is off. Therefore, a problem is that when the starting switch is switched off, the vehicle-mounted information apparatus has to be brought into a shutdown state, and the time required for restart at the time that the starting switch is switched on the next time is long.

For this problem, it is possible to suppress the decrease in the charge capacity of the vehicle battery while adopting the power saving standby state in the vehicle-mounted information apparatus, by providing a secondary battery, such as a lithium ion battery or a nickel-metal hydride battery, separately from the vehicle battery, and causing this secondary battery to supply a dark current. However, such a secondary battery has a property of, when the secondary battery is charged and discharged in a high temperature environment, decreasing its battery life. Because the operating environment of the vehicle-mounted information apparatus is generally subjected to high temperatures, a problem is that in a case in which such a secondary battery is simply provided in the vehicle-mounted information apparatus, the battery life decreases due to charge and discharge in a high temperature environment.

The present invention is made in order to solve the above-mentioned problems, and it is therefore an object of the present invention to provide a technique for shortening the time required to start a vehicle-mounted information apparatus by adopting a power saving standby state, and increasing the life of a secondary battery for this power saving standby state.

Solution to Problem

A standby state maintaining device of the present invention includes: a secondary battery disposed separately from a vehicle battery; a temperature sensor for the secondary battery; a charge storage member that supports charge and discharge in a temperature outside a reference range; and a controller having a first operation mode of, in a state in which a starting switch of a vehicle is off, maintaining a power saving standby state of vehicle-mounted information apparatus by using the secondary battery when a detected value provided by the temperature sensor is within the reference range, and maintaining the power saving standby state by using the charge storage member when the detected value is outside the reference range.

Advantageous Effects of Invention

According to the present invention, because the configuration is provided as mentioned above, the time required to start the vehicle-mounted information apparatus can be shortened by virtue of the adoption of the power saving standby state, and the life of the secondary battery for this power saving standby state can be increased.

DESCRIPTION OF EMBODIMENTS

Hereafter, in order to explain this invention in greater detail, the embodiments of the present invention will be described with reference to accompanying drawings.

Embodiment 1

Figure 1:
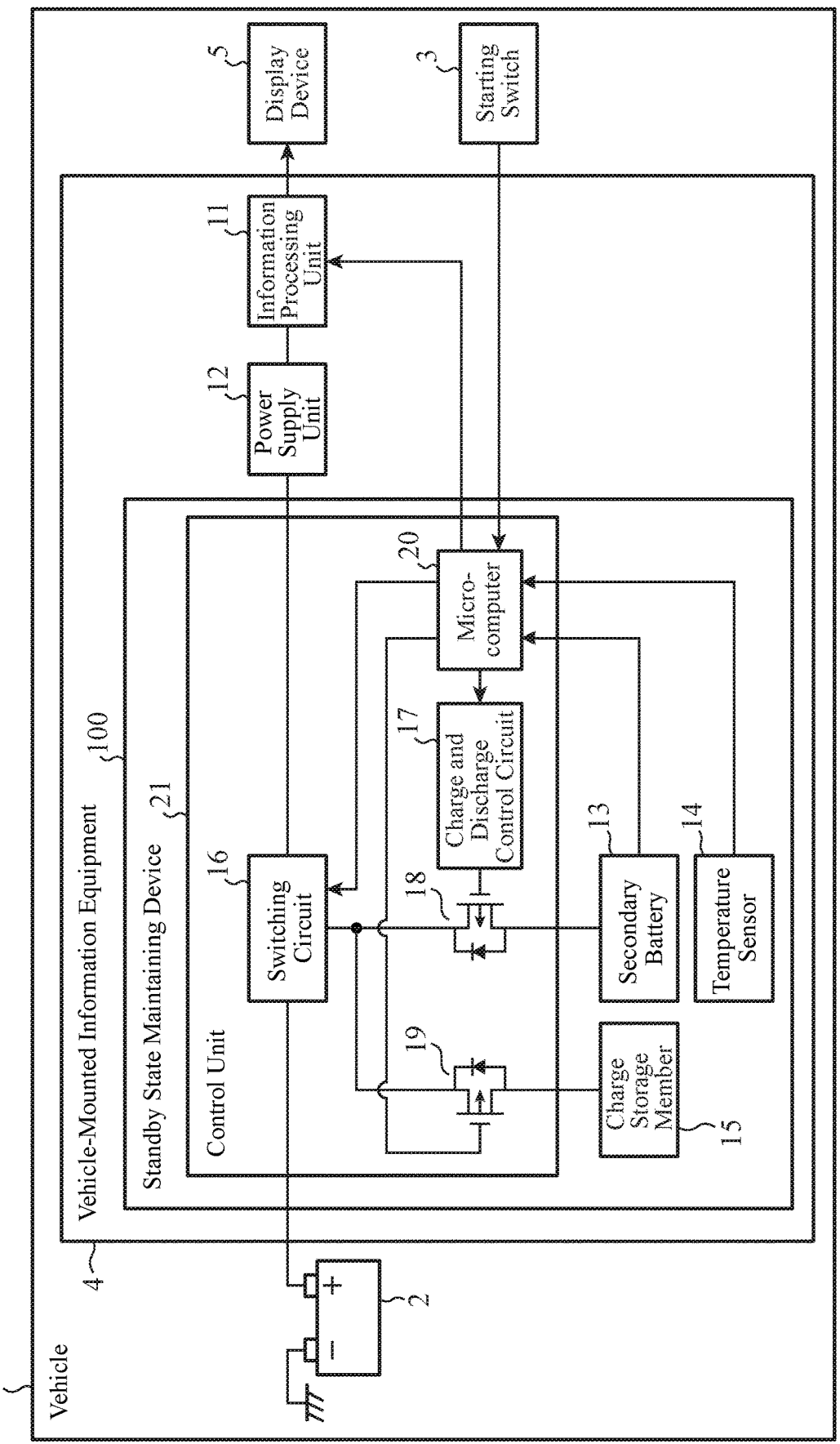
FIG. 1 is an explanatory drawing showing a main part of a standby state maintaining device according to Embodiment 1 of the present invention.
Figure 2:
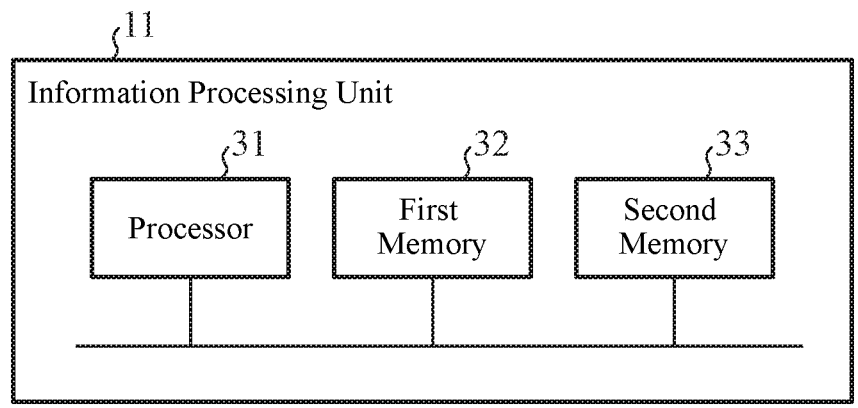
FIG. 2 is a hardware block diagram showing a main part of an information processing unit which a vehicle-mounted information apparatus according to Embodiment 1 of the present invention has.

FIG. 1 is an explanatory drawing showing a main part of a standby state maintaining device according to Embodiment 1 of the present invention. FIG. 2 is a hardware block diagram showing a main part of an information processing unit which a vehicle-mounted information apparatus according to Embodiment 1 of the present invention has. By referring to FIGS. 1 and 2, the standby state maintaining device 100 of Embodiment 1 will be explained.

As shown in FIG. 1, a vehicle 1 has a vehicle battery 2 and a starting switch 3. The vehicle battery 2 is comprised of, for example, a battery for startup in a case in which the vehicle 1 is a gasoline automobile, or an auxiliary battery in a case in which the vehicle 1 is an electric automobile. The starting switch 3 is comprised of, for example, an ignition switch in the case in which the vehicle 1 is a gasoline automobile, or a starter switch in the case in which the vehicle 1 is an electric automobile. As the starting switch 3, a request for start via communications is also included.

Further, the vehicle 1 has a vehicle-mounted information apparatus 4 and a display device 5. The vehicle-mounted information apparatus 4 is comprised of, for example, an information apparatus for exclusive use which is disposed integrally with the dashboard of the vehicle 1. The vehicle-mounted information apparatus 4 performs, for example, the functions of either car navigation or display audio. The display device 5 is comprised of, for example, a liquid crystal display or an organic EL (Electro Luminescence) display which is disposed integrally with the vehicle-mounted information apparatus 4. The display device 5 displays an image corresponding to image data outputted by the vehicle-mounted information apparatus 4. Concretely, for example, the display device 5 displays an image showing information about a travel route currently being guided using the car navigation, an image showing information about a piece of music currently being played back using the display audio, or the like.

Hereafter, a main part of the vehicle-mounted information apparatus 4 will be explained.

An information processing unit 11 implements main functions in the vehicle-mounted information apparatus 4, i.e., the functions of either the car navigation or the display audio. As shown in FIG. 2, the information processing unit 11 is comprised of a computer, and has a processor 31, a first memory 32, and a second memory 33.

The processor 31 is comprised of, for example, a CPU (Central Processing Unit) and a microcontroller (referred to as a "microcomputer" hereafter). The first memory 32 is comprised of, for example, a volatile memory such as a RAM (Random access memory). The second memory 33 is comprised of, for example, a nonvolatile memory such as a ROM (Read Only Memory), an HDD (Hard Disk Drive), or an SSD (Solid State Drive).

A program for causing the computer to function as either the car navigation or the display audio is stored in the second memory 33. The functions of either the car navigation or the display audio are implemented by the processor 31's reading and execution of the program stored in the second memory 33. The first memory 32 stores various data used for processes performed by the program.

The information processing unit 11 freely switches among an operating state, a shutdown state, and a power saving standby state, in accordance with an instruction from the microcomputer 20. The power saving standby state of the information processing unit 11 is, for example, one in which the information processing unit stands by in a state in which data in the first memory 32 is held because of the passage of a current to the first memory 32.

A power supply unit 12 supplies power to the information processing unit 11 by using power supplied from the vehicle battery 2, a secondary battery 13, or a charge storage member 15. The power supply unit 12 is comprised of, for example, a DC-DC converter.

The secondary battery 13 is disposed separately from the vehicle battery 2. The secondary battery 13 is comprised of, for example, a lithium ion battery or a nickel-metal hydride battery. The secondary battery 13 has a function of outputting a voltage value corresponding to the charge capacity of the secondary battery 13 to the microcomputer 20.

A temperature sensor 14 is used for the secondary battery 13. Concretely, for example, the temperature sensor 14 is disposed integrally with the secondary battery 13, and detects the temperature of the main body of the secondary battery 13. As an alternative, for example, the temperature sensor 14 is disposed adjacent to the secondary battery 13, and detects the ambient temperature of the secondary battery 13. The temperature sensor 14 outputs the value (referred to as the "detected value" hereafter) of the temperature detected thereby to the microcomputer 20.

The charge storage member 15 is comprised of a battery or a capacitor which satisfies the following conditions (1) to (3). Concretely, the charge storage member 15 is comprised of, for example, a super capacitor such as an electric double layer capacitor.

(1) The number of times that charge and discharge can be performed, i.e., the so-called "number of cycles" is approximately infinite.

(2) A large capacity is provided. More concretely, the charge storage capacity per unit area is 1,000 or more times as large as that of a typical capacitor such as an aluminum electrolytic capacitor.

(3) Charge and discharge in a high temperature environment, i.e., an environment in which the temperature is higher than a first threshold mentioned later (e.g., +60° C.) are supported. More concretely, the amount of decrease of a life due to charge and discharge in a high temperature environment is smaller than that of a typical secondary battery such as a lithium ion battery, and there is a low possibility that an explosion occurs due to charge and discharge in a high temperature environment.

A switching circuit 16 is disposed among the vehicle battery 2, the secondary battery 13 and the charge storage member 15, and the power supply unit 12. The switching circuit 16 has one or more not-illustrated switches, and freely switches the turning on/off of an electric connection between the vehicle battery 2 and the power supply unit 12, the turning on/off of an electric connection between the secondary battery 13 and the charge storage member 15, and the power supply unit 12, and the turning on/off of an electric connection between the vehicle battery 2, and the secondary battery 13 and the charge storage member 15. The switching on and off of each of the switches is controlled by the microcomputer 20.

A charge and discharge control circuit 17 controls the charge and discharge of the secondary battery 13 by switching the turning on/off of a first switching element 18 disposed between the secondary battery 13 and the switching circuit 16 in accordance with an instruction from the microcomputer 20. The first switching element 18 is comprised of, for example, an FET (Field Effect Transistor).

On the other hand, the switching on and off of a second switching element 19 disposed between the charge storage member and the secondary battery 13 is controlled by the microcomputer 20. More specifically, a charge and discharge control circuit for the charge storage member 15 is unnecessary, and the charge and discharge of the charge storage member 15 is controlled directly by the microcomputer 20. The second switching element 19 is comprised of, for example, an FET.

A range (referred to as a "reference range" hereafter) of values which is an object to be compared with the detected value provided by the temperature sensor 14 is set to the microcomputer 20 in advance. As the reference range, for example, a range in which an upper limit is set, but no lower limit is set, i.e., a range including values equal to or less than a predetermined threshold (referred to as a "first threshold" hereafter, e.g., +60° C.) is set up. Further, a value (referred to as a "reference capacity" hereafter, e.g., a value-of 5% the charge capacity in a state in which the secondary battery 13 is fully charged) which is an object to be compared with the charge capacity of the secondary battery 13 is set to the microcomputer 20 in advance. In addition, a value (referred to as a "first reference time" hereafter, e.g., 30 minutes) which is an object to be compared with the duration of the power saving standby state using the charge storage member 15 is set to the microcomputer 20 in advance.

The microcomputer 20 has an operation mode (referred to as a "first operation mode" hereafter) of, in a state in which the starting switch 3 is off, maintaining the power saving standby state of the information processing unit 11 when the detected value provided by the temperature sensor 14 is within the reference range, and maintaining the power saving standby state of the information processing unit 11 by using the charge storage member 15 when the detected value provided by the temperature sensor 14 is outside the reference range. The details of the operation of the microcomputer 20 in the first operation mode will be described later by reference to a flowchart of FIG. 3.

Further, in a state in which the starting switch 3 is on, the microcomputer 20 sets the electric connection in the switching circuit 16 between the vehicle battery 2 and the power supply unit 12 to the on state. As a result, the power supply unit 12 supplies power to the information processing unit 11 by using the power supplied from the vehicle battery 2.

Further, in the state in which the starting switch 3 is on, the microcomputer 20 sets the electric connection in the switching circuit 16 between the vehicle battery 2, and the secondary battery 13 and the charge storage member 15 to the on state, and also instructs the charge and discharge control circuit 17 to charge the secondary battery 13. As a result, the secondary battery 13 is charged.

Further, in the state in which the starting switch 3 is on, the microcomputer 20 sets the electric connection in the switching circuit 16 between the vehicle battery 2, and the secondary battery 13 and the charge storage member 15 to the on state, and also sets the second switching element 19 to the on state. As a result, the charge storage member 15 is charged.

A control unit 21 is composed of the switching circuit 16, the charge and discharge control circuit 17, the first switching element 18, the second switching element 19, and the microcomputer 20. The standby state maintaining device 100 is composed of the secondary battery 13, the temperature sensor 14, the charge storage member 15, and the control unit 21. The vehicle-mounted information apparatus 4 is composed of the information processing unit 11, the power supply unit 12, and the standby state maintaining device 100.

Figure 3A:
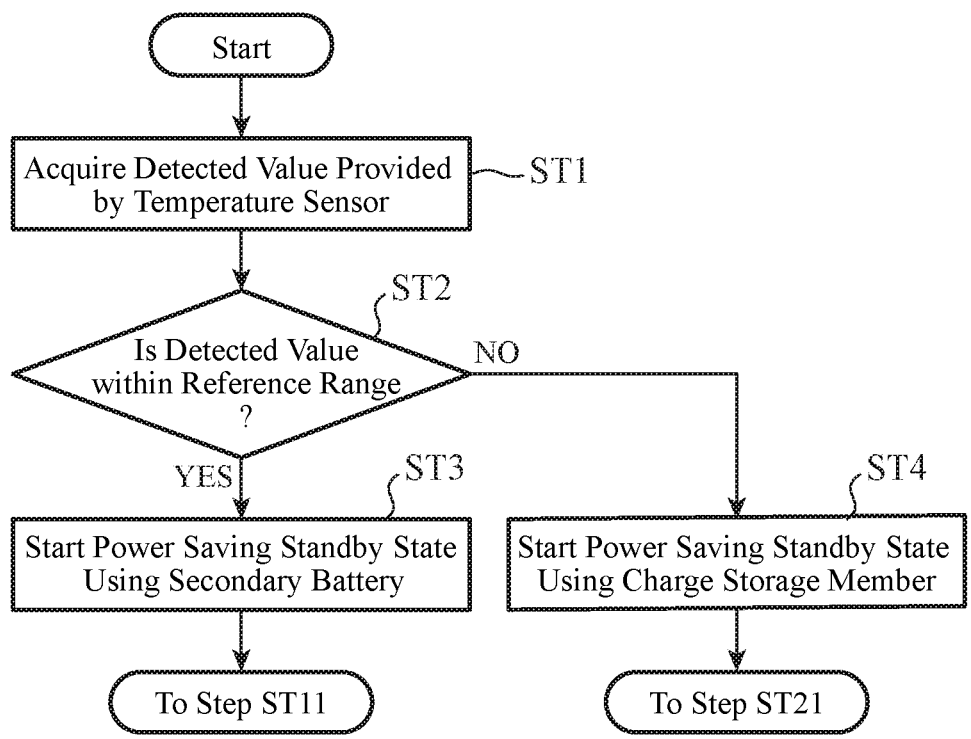
FIG. 3A is a flowchart showing the operation of the standby state maintaining device according to Embodiment 1 of the present invention.

Next, operations of the standby state maintaining device 100 will be explained by reference to the flowchart of FIG. 3, focusing on an operation in the first operation mode which is performed by the microcomputer 20. In an initial state, the starting switch 3 is in the on state, the power supply unit 12 supplies power to the information processing unit 11 by using the power supplied from the vehicle battery 2, and the information processing unit 11 is in the operating state. Further, the secondary battery 13 is in a state in which a charge is completed, and the charge storage member 15 is in a state in which a charge is completed.

More specifically, the electric connection in the switching circuit 16 between the vehicle battery 2 and the power supply unit 12 is in the on state, the electric connection between the secondary battery 13 and the charge storage member 15, and the power supply unit 12 is in the off state, and the electric connection between the vehicle battery 2, and the secondary battery 13 and the charge storage member 15 is in the off state. Further, the first switching element 18 is in the off state, and the second switching element 19 is in the off state. When the starting switch 3 is switched from the on state to the off state, the microcomputer 20 starts a process of step ST1.

First, the microcomputer 20, in step ST1, acquires the detected value provided by the temperature sensor 14 from the temperature sensor 14. Then, the microcomputer 20, in step ST2, determines whether or not the detected value acquired in step ST1 is within the reference range.

When the detected value acquired in step ST1 is within the reference range ("YES" in step ST2), the microcomputer 20, in step ST3, starts the power saving standby state using the secondary battery 13. More specifically, the microcomputer 20 switches the electric connection in the switching circuit 16 between the vehicle battery 2 and the power supply unit 12 from the on state to the off state, and also switches the electric connection between the secondary battery 13 and the charge storage member 15, and the power supply unit 12 from the off state to the on state. Further, the microcomputer 20 instructs the charge and discharge control circuit 17 to start discharging the secondary battery 13. In addition, the microcomputer 20 instructs the information processing unit 11 to switch from the operating state to the power saving standby state.

In contrast, when the detected value acquired in step ST1 is outside the reference range ("NO" in step ST2), the microcomputer 20, in step ST4, starts the power saving standby state using the charge storage member 15. More specifically, the microcomputer 20 switches the electric connection in the switching circuit 16 between the vehicle battery 2 and the power supply unit 12 from the on state to the off state, and also switches the electric connection between the secondary battery 13 and the charge storage member 15, and the power supply unit from the off state to the on state. Further, the microcomputer 20 switches the second switching element 19 from the off state to the on state. In addition, the microcomputer 20 instructs the information processing unit 11 to switch from the operating state to the power saving standby state.

After step ST3, the microcomputer 20, in step ST11, acquires the detected value provided by the temperature sensor 14 from the temperature sensor 14. Then, the microcomputer 20, in step ST12, determines whether or not the detected value acquired in step ST11 is within the reference range.

When the detected value acquired in step ST11 is within the reference range ("YES" in step ST12), the microcomputer 20, in step ST13, acquires the voltage value corresponding to the charge capacity of the secondary battery 13 from the secondary battery 13. Then, the microcomputer 20, in step ST14, determines whether or not the charge capacity of the secondary battery 13 is equal to or greater than the reference capacity by using the voltage value acquired in step ST13.

When the charge capacity of the secondary battery 13 is equal to or greater than the reference capacity ("YES" in step ST14), the microcomputer 20 returns to the process of step ST11 while continuing the power saving standby state using the secondary battery 13 (step ST15).

In contrast, when the charge capacity of the secondary battery 13 is less than the reference capacity ("NO" in step ST14), the microcomputer 20, in step ST16, ends the power saving standby state. More specifically, the microcomputer 20 switches the electric connection in the switching circuit 16 between the secondary battery 13 and the charge storage member 15, and the power supply unit 12 from the on state to the off state. Further, the microcomputer 20 instructs the charge and discharge control circuit 17 to end the discharge of the secondary battery 13. In addition, the microcomputer 20 instructs the information processing unit 11 to switch from the power saving standby state to the shutdown state.

Further, when the detected value acquired in step ST11 is outside the reference range ("NO" in step ST12), the microcomputer 20, in step ST17, switches from the power saving standby state using the secondary battery 13 to the power saving standby state using the charge storage member 15. More specifically, the microcomputer 20 instructs the charge and discharge control circuit 17 to end the discharge of the secondary battery 13, and also switches the second switching element 19 from the off state to the on state.

After step ST4 or ST17, the microcomputer 20, in step ST21, calculates the duration of the power saving standby state using the charge storage member 15. More concretely, the microcomputer 20 calculates the cumulative sum of durations of the power saving standby state using the charge storage member 15 which occur after the starting switch 3 has been switched off. Then, the microcomputer 20, in step ST22, compares the duration calculated in step ST21 with the first reference time.

When the duration calculated in step ST21 is equal to or less than the first reference time ("NO" in step ST22), the microcomputer 20, in step ST23, acquires the detected value provided by the temperature sensor 14 from the temperature sensor 14. Then, the microcomputer 20, in step ST24, determines whether or not the detected value acquired in step ST23 is within the reference range.

When the detected value acquired in step ST23 is outside the reference range ("NO" in step ST24), the microcomputer 20 returns to the process of step ST21 while continuing the power saving standby state using the charge storage member 15 (step ST25).

In contrast, when the detected value acquired in step ST23 is within the reference range ("YES" in step ST24), the microcomputer 20, in step ST26, switches from the power saving standby state using the charge storage member 15 to the power saving standby state using the secondary battery 13. More specifically, the microcomputer 20 switches the second switching element 19 from the on state to the off state, and also instructs the charge and discharge control circuit 17 to start discharging the secondary battery 13. After step ST26, the microcomputer 20 advances to the process of step ST11.

Further, when the duration calculated in step ST21 exceeds the first reference time ("YES" in step ST22), the microcomputer 20, in step ST27, ends the power saving standby state. More specifically, the microcomputer 20 switches the electric connection in the switching circuit 16 between the secondary battery 13 and the charge storage member 15, and the power supply unit 12 from the on state to the off state. Further, the microcomputer 20 switches the states of the second switching element 19 from the on state to the off state. In addition, the microcomputer 20 instructs the information processing unit 11 to switch from the power saving standby state to the shutdown state.

In this way, in the state in which the starting switch 3 is off, the standby state maintaining device 100 of Embodiment 1 maintains the power saving standby state of the information processing unit 11 by using the secondary battery 13 when the detected value provided by the temperature sensor 14 is within the reference range (steps ST11 to ST15), whereas the standby state maintaining device maintains the power saving standby state of the information processing unit 11 by using the charge storage member 15 when the detected value provided by the temperature sensor 14 is outside the reference range (steps ST21 to ST25). By virtue of the adoption of the power saving standby state, the time required to start the vehicle-mounted information apparatus 4 at the time that the starting switch 3 is switched on can be shortened. Further, by maintaining the power saving standby state by selectively using either the secondary battery 13 or the charge storage member 15 in accordance with the detected value provided by the temperature sensor 14, the decrease in the charge capacity of the vehicle battery 2 due to a dark current in the state in which the starting switch 3 is off can be prevented, and the life of the secondary battery 13 can be increased.

In particular, by setting the upper limit on the reference range, i.e., the first threshold to an appropriate value, the secondary battery 13 can be prevented from being discharged in a high temperature environment. As a result, the decrease in the battery life of the secondary battery 13 due to the discharge can be prevented.

The functions implemented by the information processing unit 11 are not limited to those of either the car navigation or the display audio. The information processing unit 11 can implement any function in the vehicle-mounted information apparatus 4.

Further, the power saving standby state of the information processing unit 11 can be one in which the information processing unit stands by in a state in which the passage of a current to the CPU of the processor 31, in addition to the passage of a current to the first memory 32, is held. As a result, the time required to start the vehicle-mounted information apparatus 4 at the time that the starting switch 3 is switched on can be further shortened.

Further, the microcomputer 20 can be constituted integrally with the microcomputer of the processor 31. As a result, the number of microcomputers in the vehicle-mounted information apparatus 4 can be reduced.

Further, the value of the first threshold is not limited to +60° C. The first threshold can be set to any value in accordance with the heat resistance of the secondary battery 13, a characteristic showing the amount of decrease for temperature of the battery life, the decrease being caused by charge and discharge.

Further, the value of the first reference time is not limited to 30 minutes. The first reference time can be set to a time making it possible to maintain the power saving standby state by using the charge storage member 15, in accordance with the capacity of the charge storage member 15, the magnitude of the dark current consumed by the information processing unit 11.

Further, the value of the reference capacity is not limited to 5% of the charge capacity in the state in which the secondary battery 13 is fully charged. The reference capacity can be set to any value in accordance with the capacity of the secondary battery 13, the magnitude of the dark current consumed by the information processing unit 11.

Further, as the reference range, a range in which an upper limit is set and a lower limit is set, i.e., a range including values equal to or greater than a predetermined threshold (referred to as a "second threshold" hereafter, e.g., −20° C.) and equal to or less than the first threshold can be set up. The secondary battery 13 has, in addition to the property of decreasing its battery life when charge and discharge are performed in a high temperature environment, as mentioned above, the property of decreasing its battery life also when charge and discharge are performed in a low temperature environment. By setting the lower limit on the reference range, i.e., the second threshold to an appropriate value, the secondary battery 13 can be prevented from being discharged in a low temperature environment. As a result, the decrease in the battery life of the secondary battery 13 due to the discharge can be prevented.

Further, in the case in which the lower limit is set to the reference range, it is preferable that as the charge storage member 15, a battery or a capacitor which satisfies the following condition (4) in addition to the above-mentioned conditions (1) to (3) is used.

(4) Charge and discharge in a low temperature environment, i.e., an environment in which the temperature is lower than a second threshold (e.g., −20° C.) are supported. More concretely, the amount of decrease of the life due to charge and discharge in a low temperature environment is smaller than that of a typical secondary battery such as a lithium ion battery.

Figure 3B:
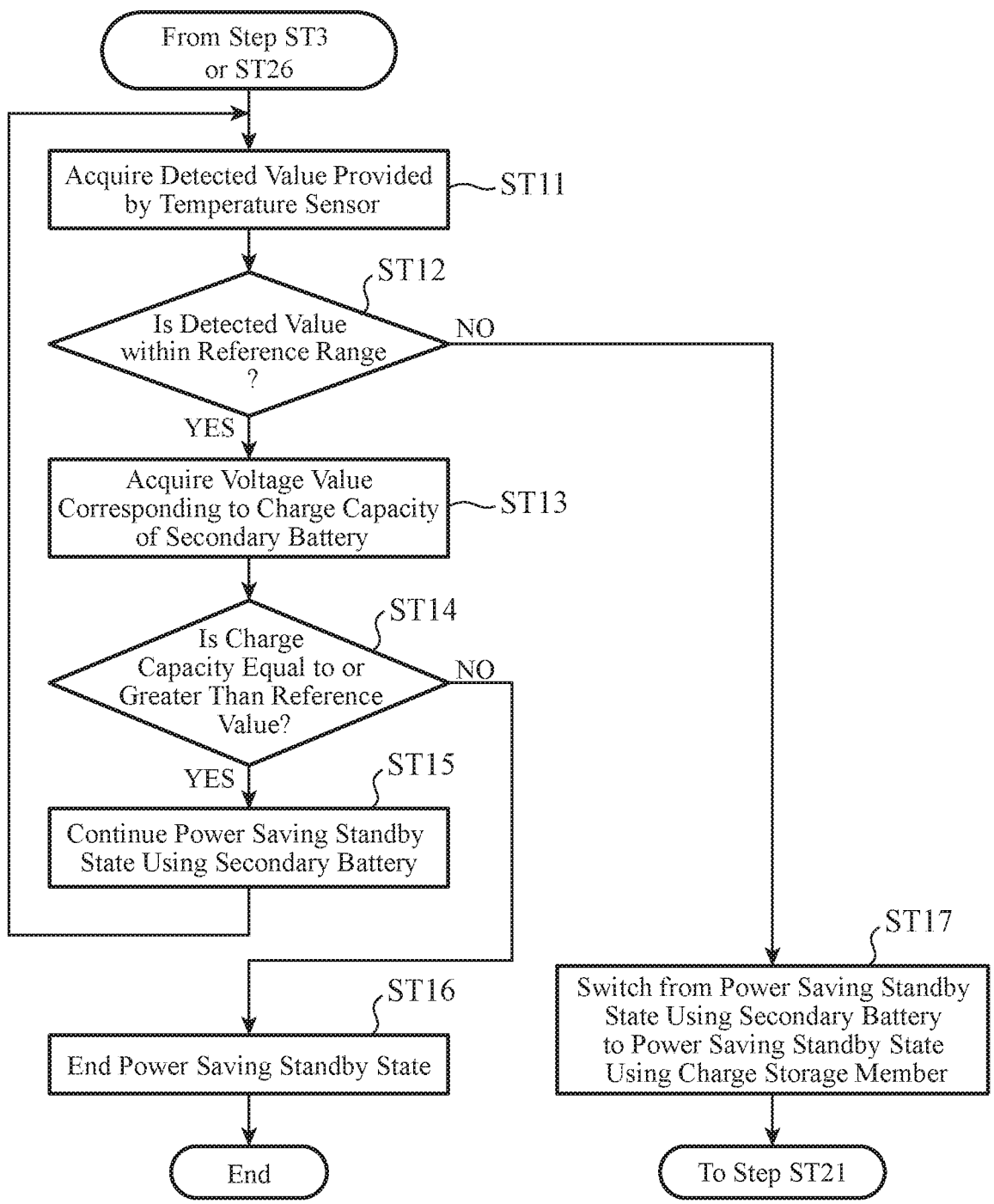
FIG. 3B is a flowchart showing an operation of the standby state maintaining device according to Embodiment 1 of the present invention.
Figure 3C:
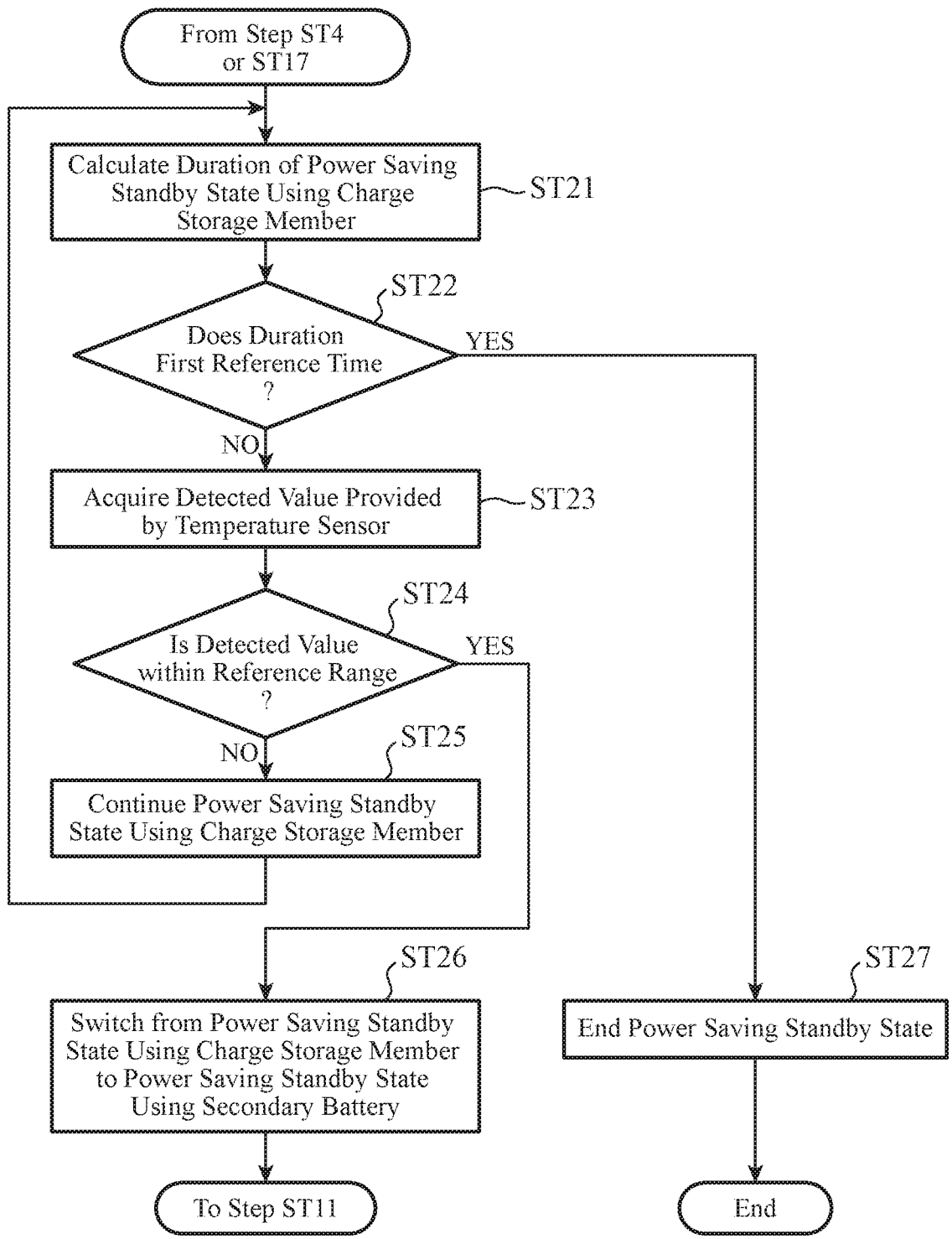
FIG. 3C is a flowchart showing an operation of the standby state maintaining device according to Embodiment 1 of the present invention.
Figure 4:
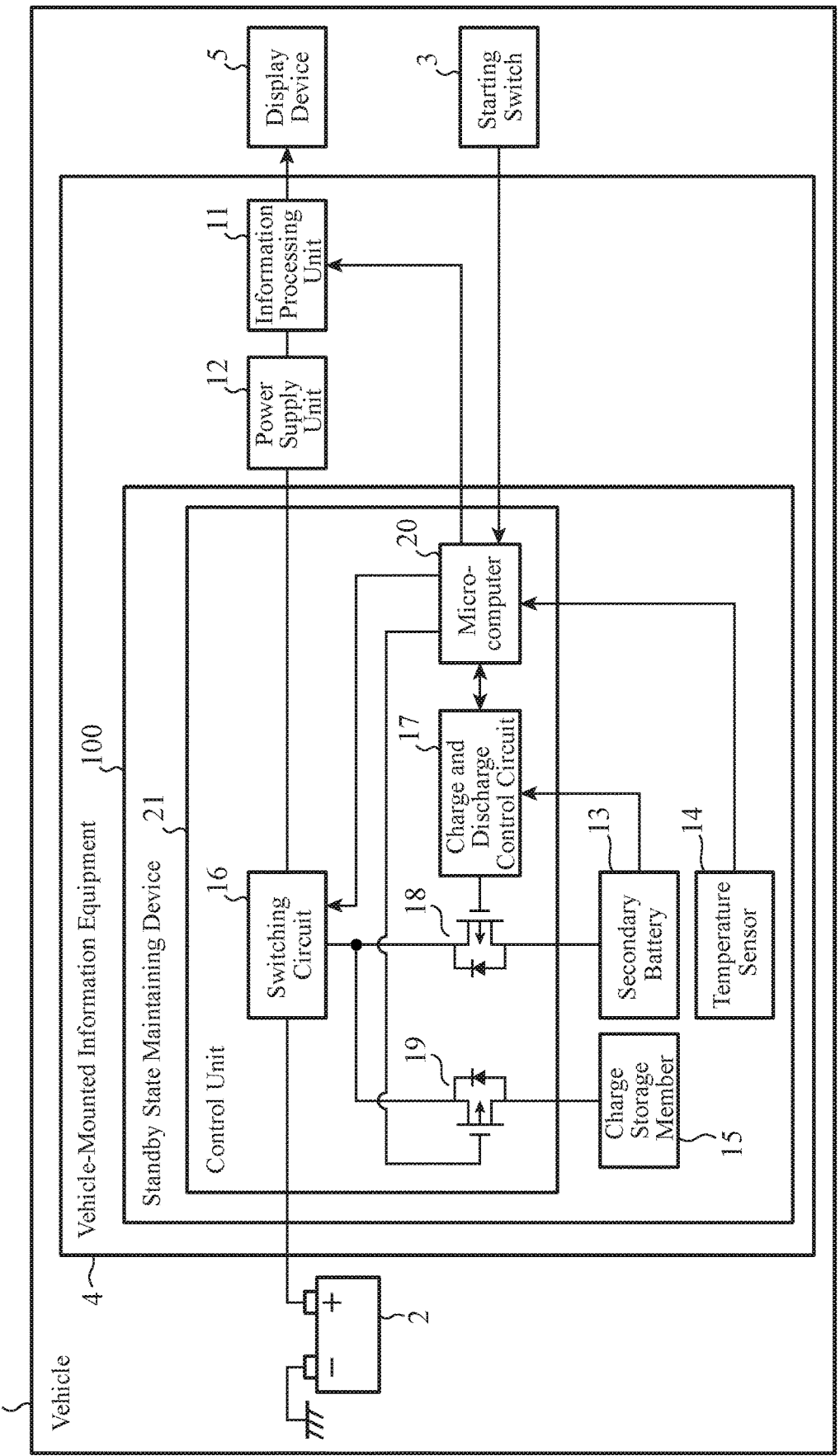
FIG. 4 is an explanatory drawing showing a main part of another standby state maintaining device according to Embodiment 1 of the present invention.

Further, the charge and discharge control circuit 17 can have a not-illustrated CPU. Further, the processes of steps ST13 and ST14 which are shown in FIG. 3B can be performed by the CPU instead of the microcomputer 20. An example of the standby state maintaining device 100 in this case is shown in FIG. 4. The CPU in the charge and discharge control circuit 17 acquires the voltage value corresponding to the charge capacity of the secondary battery 13 from the secondary battery 13 in accordance with an instruction from the microcomputer 20 (step ST13). Then, the CPU in the charge and discharge control circuit 17 determines whether or not the charge capacity of the secondary battery 13 is equal to or greater than the reference capacity by using the voltage value acquired in step ST13 (step ST14). The CPU in the charge and discharge control circuit 17 outputs a result of the determination to the microcomputer 20.

Figure 5:
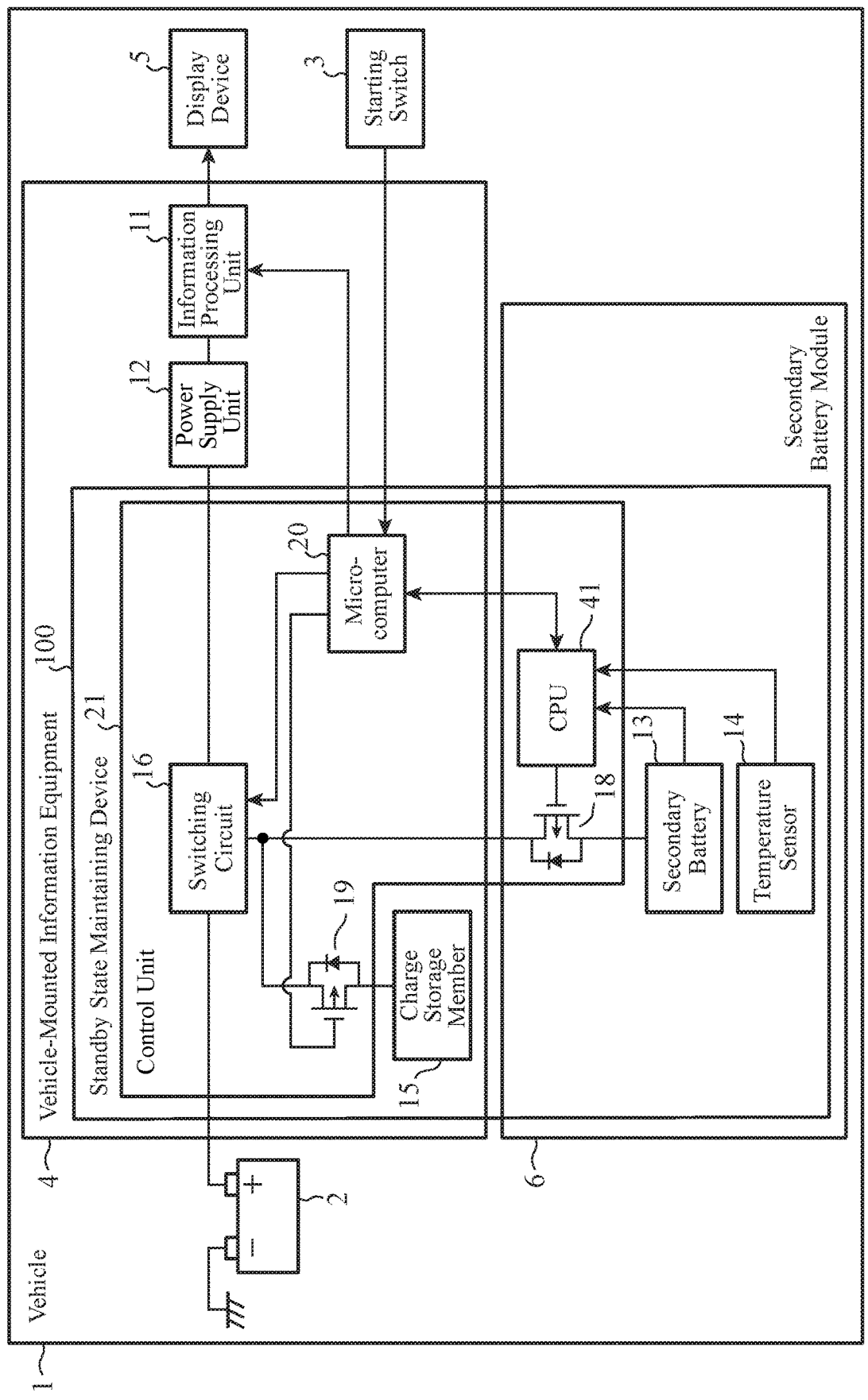
FIG. 5 is an explanatory drawing showing a main part of another standby state maintaining device according to Embodiment 1 of the present invention.

Further, some of the components of the standby state maintaining device 100 can be disposed outside the vehicle-mounted information apparatus 4. An example of the standby state maintaining device 100 in this case is shown in FIG. 5. As shown in FIG. 5, a secondary battery module 6 is disposed outside the vehicle-mounted information apparatus 4. The vehicle-mounted information apparatus 4 and the secondary battery module 6 are connected to each other in such a way that power supply is performed freely between them via an electric supply line, and in such a way that communications are performed freely between them via a control line. The secondary battery 13, the temperature sensor 14, and the first switching element 18 in the standby state maintaining device 100 are disposed in the secondary battery module 6. Further, a CPU 41 which serves as the function of the charge and discharge control circuit 17 shown in FIG. 1 is disposed in the secondary battery module 6. The processing shown in FIG. 3 is implemented by cooperation of the microcomputer 20 disposed in the vehicle-mounted information apparatus 4 and the CPU 41 disposed in the secondary battery module 6.

As mentioned above, the standby state maintaining device 100 of Embodiment 1 includes the secondary battery 13 disposed separately from the vehicle battery 2, the temperature sensor 14 for the secondary battery 13, the charge storage member 15 that is charged and discharged in a temperature outside the reference range, and the control unit 21 having the first operation mode of, in the state in which the starting switch 3 of the vehicle 1 is off, maintaining the power saving standby state of the vehicle-mounted information apparatus 4 by using the secondary battery 13 when the detected value provided by the temperature sensor 14 is within the reference range, and maintaining the power saving standby state by using the charge storage member 15 when the detected value is outside the reference range. By virtue of the adoption of the power saving standby state, the time required to start the vehicle-mounted information apparatus 4 at the time that the starting switch 3 is switched on can be shortened. Further, by maintaining the power saving standby state by selectively using either the secondary battery 13 or the charge storage member 15 in accordance with the detected value provided by the temperature sensor 14, the decrease in the charge capacity of the vehicle battery 2 due to a dark current in the state in which the starting switch 3 is off can be prevented, and the life of the secondary battery 13 can be prolonged. In particular, by setting the reference range to an appropriate range, the secondary battery 13 can be prevented from being discharged in a high temperature environment or a low temperature environment. As a result, the decrease in the battery life of the secondary battery 13 due to the discharge can be prevented.

Further, when the detected value falls outside the reference range ("NO" in step ST12) while the power saving standby state is maintained using the secondary battery 13 in the first operation mode (steps ST11 to ST15), the control unit 21 switches the states of the vehicle-mounted information apparatus 4 from the power saving standby state using the secondary battery 13 to the power saving standby state using the charge storage member 15 (step ST17). As a result, the secondary battery 13 can be prevented more surely from being discharged in a high temperature environment or a low temperature environment.

Further, when the charge capacity of the secondary battery 13 becomes less than the reference capacity ("NO" in step ST14) while the power saving standby state is maintained using the secondary battery 13 in the first operation mode (steps ST11 to ST15), the control unit 21 ends the power saving standby state (step ST16). By setting the reference capacity to an appropriate value, the overdischarge of the secondary battery 13 can be prevented.

Further, when the detected value falls within the reference range ("YES" in step ST24) while the power saving standby state is maintained using the charge storage member 15 in the first operation mode (steps ST21 to ST25), the control unit 21 switches the states of the vehicle-mounted information apparatus 4 from the power saving standby state using the charge storage member 15 to the power saving standby state using the secondary battery 13 (step ST26). In the case in which a super capacitor is used as the charge storage member 15, the charge storage member 15 has a larger capacity than a typical capacitor such as an aluminum electrolytic capacitor while the charge storage member has a smaller capacity than a typical secondary battery such as a lithium ion battery. By switching from the power saving standby state using the charge storage member 15 to the power saving standby state using the secondary battery 13, the decrease in the charge capacity of the charge storage member 15 can be suppressed.

Further, when the duration of the power saving standby state using the charge storage member 15 exceeds the first reference time ("YES" in step ST22) while the power saving standby state is maintained using the charge storage member 15 in the first operation mode (steps ST21 to ST25), the control unit 21 ends the power saving standby state (step ST27). By setting the first reference time to an appropriate value, the power saving standby state can be maintained until just before the charge capacity of the charge storage member 15 becomes a zero value.

Further, as the reference range, either a range including values equal to or less than the first threshold, or a range including values equal to or greater than the second threshold less than the first threshold, and equal to or less than the first threshold is set up. By setting the first threshold to an appropriate value, the secondary battery 13 can be prevented from being discharged in a high temperature environment. Further, by setting the second threshold to an appropriate value, the secondary battery 13 can be prevented from being discharged in a low temperature environment.

Further, the secondary battery 13 is comprised of a lithium ion battery or a nickel-metal hydride battery. In general, the amounts of decrease of the battery lives of a lithium ion battery and a nickel-metal hydride battery at the time that charge and discharge are performed in a high temperature environment are greater than that of a nickel cadmium battery. Therefore, the battery life can be greatly improved by avoiding discharge in a high temperature environment.

Further, the charge storage member 15 is comprised of a super capacitor. As a result, the charge storage member 15 which satisfies the above-mentioned conditions (1) to (4) can be provided.

Embodiment 2

Figure 6:
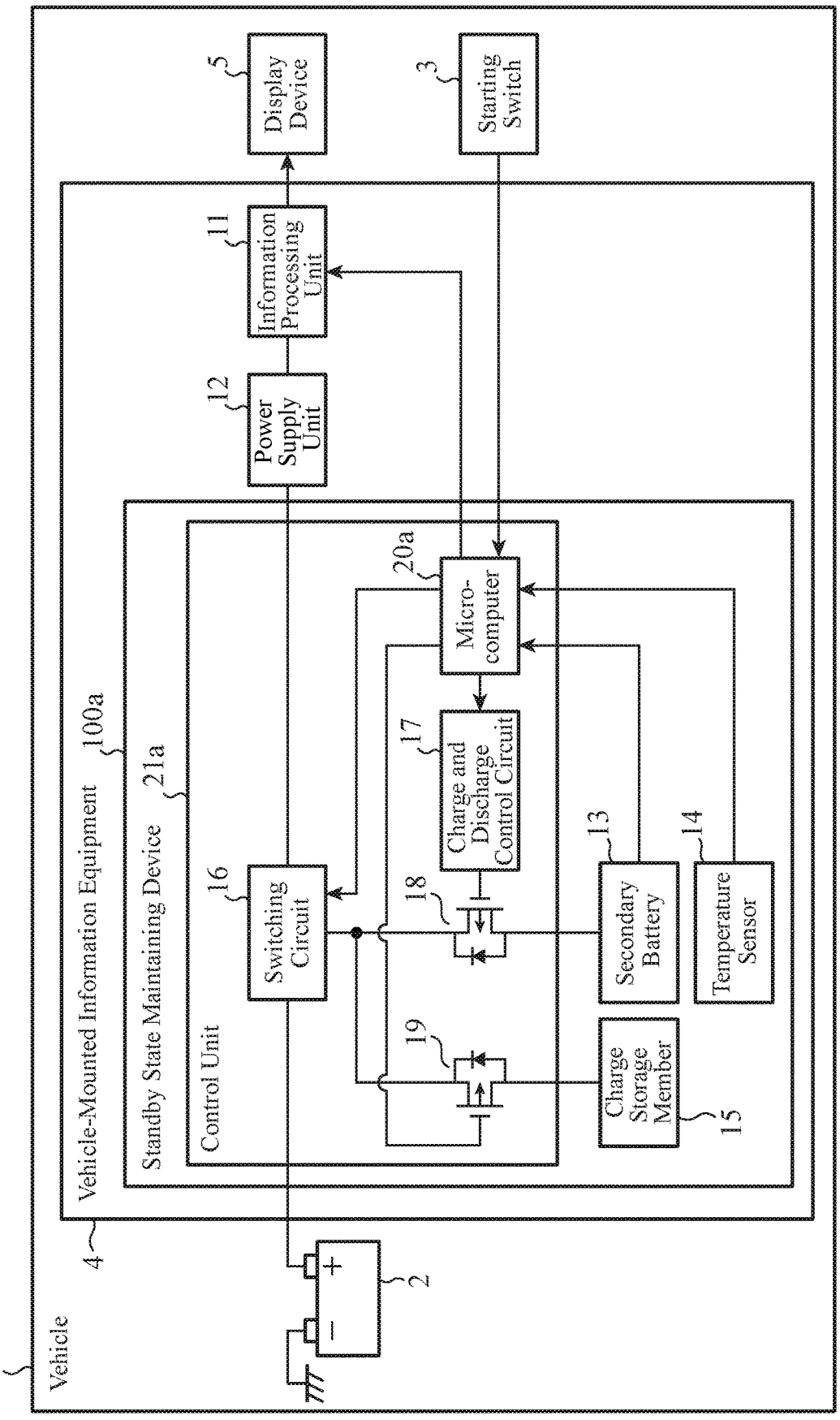
FIG. 6 is an explanatory drawing showing a main part of a standby state maintaining device according to Embodiment 2 of the present invention.

FIG. 6 is an explanatory drawing showing a main part of a standby state maintaining device according to Embodiment 2 of the present invention. By referring to FIG. 6, the standby state maintaining device 100a of Embodiment 2 will be explained. The same components as those of the standby state maintaining device 100 of Embodiment 1 shown in FIG. 1 are denoted by the same reference numerals, and an explanation of the components will be omitted hereafter. Further, because the hardware configuration of an information processing unit 11 is the same as that explained by reference to FIG. 2 in Embodiment 1, an illustration and an explanation of the hardware configuration will be omitted hereafter.

A microcomputer 20a has the same first operation mode as that of the microcomputer 20 according to Embodiment 1. In addition to this mode, the microcomputer 20a has an operation mode (referred to as a "second operation mode" hereafter) of, in a state in which a starting switch 3 is off, maintaining a power saving standby state of the information processing unit 11 by using a charge storage member 15. The microcomputer 20a performs the second operation mode until a predetermined time (referred to as a "second reference time" hereafter, e.g., 30 minutes) elapses since the starting switch 3 has been switched off, and performs the first operation mode after the second reference time elapses.

Further, in a state in which the starting switch 3 is on, the microcomputer 20a sets an electric connection in a switching circuit 16 between a vehicle battery 2 and a power supply unit 12 to an on state, like the microcomputer 20 according to Embodiment 1. As a result, the power supply unit 12 supplies power to the information processing unit 11 by using power supplied from the vehicle battery 2.

Further, in the state in which the starting switch 3 is on, the microcomputer 20a sets an electric connection in the switching circuit 16 between the vehicle battery 2, and a secondary battery 13 and the charge storage member 15 to an on state, and also instructs a charge and discharge control circuit 17 to charge the secondary battery 13, like the microcomputer 20 according to Embodiment 1. As a result, the secondary battery 13 is charged.

Further, in the state in which the starting switch 3 is on, the microcomputer 20a sets the electric connection in the switching circuit 16 between the vehicle battery 2, and the secondary battery 13 and the charge storage member 15 to the on state, and also sets a second switching element 19 to an on state, like the microcomputer 20 according to Embodiment 1. As a result, the charge storage member 15 is charged.

A control unit 21a is comprised of the switching circuit 16, the charge and discharge control circuit 17, a first switching element 18, the second switching element 19, and the microcomputer 20a. The standby state maintaining device 100a is comprised of the secondary battery 13, a temperature sensor 14, the charge storage member 15, and the control unit 21a.

Figure 7:
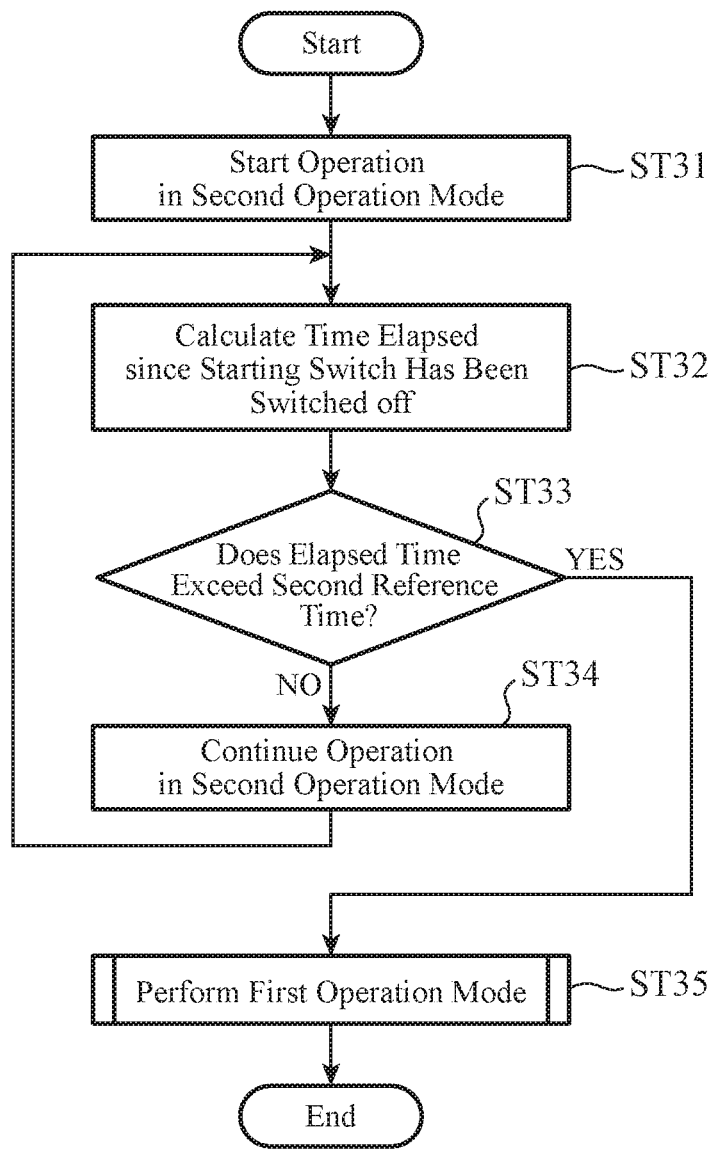
FIG. 7 is a flowchart showing the operation of the standby state maintaining device according to Embodiment 2 of the present invention.

Next, operations of the standby state maintaining device 100a will be explained by reference to a flowchart of FIG. 7, focusing on operations in the first operation mode and in the second operation mode which are performed by the microcomputer 20a. In an initial state, the starting switch 3 is in the on state, the power supply unit 12 supplies power to the information processing unit 11 by using the power supplied from the vehicle battery 2, and the information processing unit 11 is in an operating state. Further, the secondary battery 13 is in a state in which a charge is completed, and the charge storage member 15 is in a state in which a charge is completed.

More specifically, the electric connection in the switching circuit 16 between the vehicle battery 2 and the power supply unit 12 is in the on state, the electric connection between the secondary battery 13 and the charge storage member 15, and the power supply unit 12 is in the off state, and the electric connection between the vehicle battery 2, and the secondary battery 13 and the charge storage member 15 is in the off state. Further, the first switching element 18 is in the off state, and the second switching element 19 is in the off state. When the starting switch 3 is switched from the on state to the off state, the microcomputer 20a starts a process of step ST31.

First, in step ST31, the microcomputer 20a starts the operation in the second operation mode. More specifically, the microcomputer 20a switches the electric connection in the switching circuit 16 between the vehicle battery 2 and the power supply unit 12 from the on state to the off state, and also switches the electric connection between the secondary battery 13 and the charge storage member 15, and the power supply unit from the off state to the on state. Further, the microcomputer 20a switches the second switching element 19 from the off state to the on state. In addition, the microcomputer 20a instructs the information processing unit 11 to switch from the operating state to the power saving standby state.

Then, the microcomputer 20a, in step ST32, calculates the time which has elapsed since the starting switch 3 has been switched off. Then, the microcomputer 20a, in step ST33, compares the elapsed time calculated in step ST32 with the second reference time.

When the elapsed time calculated in step ST32 is equal to or less than the second reference time ("NO" in step ST33), the microcomputer 20a returns to the process of step ST32 while continuing the operation in the second operation mode (step ST34).

In contrast, when the elapsed time calculated in step ST32 exceeds the second reference time ("YES" in step ST33), the microcomputer 20a performs the first operation mode (step ST35). Concretely, for example, the microcomputer 20a advances to the process of step ST23 shown in FIG. 3C.

For example, when the driver parks or stops a vehicle 1 for the purpose of shopping or fueling, there is a high probability that the parking or stopping will be ended in a short time. In such short-time parking or stopping, there is a high probability that the power saving standby state can be maintained using the electric charge stored in the charge storage member 15 until the starting switch 3 is switched on again.

Therefore, the standby state maintaining device 100a of Embodiment 2 performs the second operation mode to maintain the power saving standby state of the information processing unit 11 by using the charge storage member 15 until the predetermined time, i.e., the second reference time elapses since the starting switch 3 has been switched off. As a result, in short-time parking or stopping, the secondary battery 13 can be prevented from being discharged. As a result, the number of times of the charge and discharge of the secondary battery 13 can be reduced, and the life of the secondary battery 13 can be further increased.

The value of the second reference time is not limited to 30 minutes. The second reference time can be set to a time making it possible to maintain the power saving standby state by using the charge storage member 15, in accordance with the capacity of the charge storage member 15, the magnitude of the dark current consumed by the information processing unit 11. Further, the second reference time can be the same as the first reference time, or can be different from the first reference time.

Further, the standby state maintaining device 100a of Embodiment 2 can adopt various variants which are the same as those explained in Embodiment 1. For example, a part of the processing in the first operation mode can be performed by a CPU in the charge and discharge control circuit 17, like in the case of the example shown in FIG. 4. As an alternative, for example, the secondary battery 13, the temperature sensor 14 can be disposed outside a vehicle-mounted information apparatus 4, like in the case of the example shown in FIG. 5.

As mentioned above, in the standby state maintaining device 100a of Embodiment 2, the control unit 21a has the second operation mode of, in the state in which the starting switch 3 is off, maintaining the power saving standby state by using the charge storage member 15. By performing the second operation mode, the number of times of the charge and discharge of the secondary battery 13 can be reduced, and the life of the secondary battery 13 can be further increased.

Further, the control unit 21a performs the second operation mode until the second reference time elapses since the starting switch 3 has been switched off (steps ST31 to ST34), and performs the first operation mode after the second reference time elapses (step ST35). As a result, in short-time parking or stopping, the secondary battery 13 can be prevented from being discharged. As a result, the number of times of the charge and discharge of the secondary battery 13 can be reduced, and the life of the secondary battery 13 can be further increased.

Embodiment 3

Figure 8:
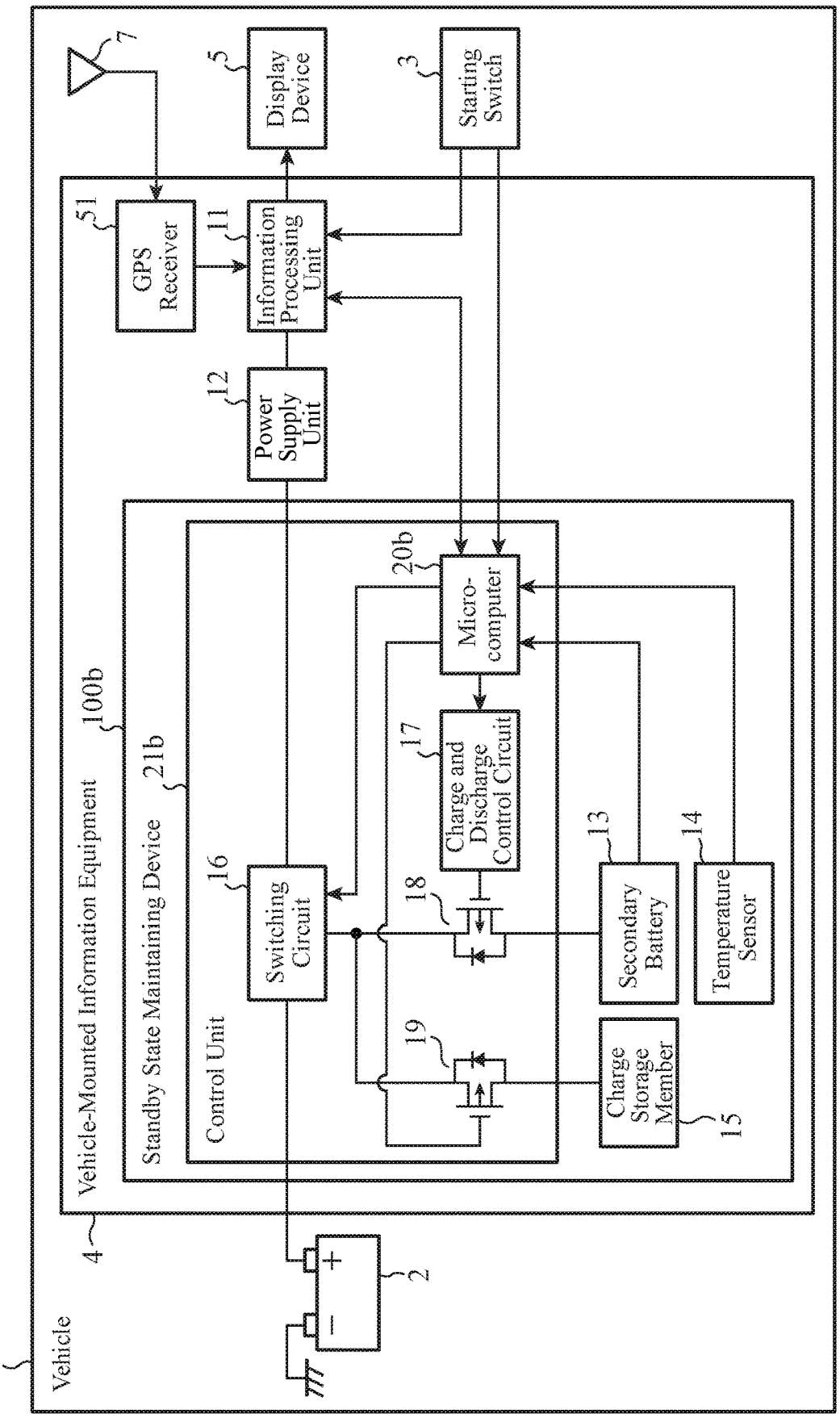
FIG. 8 is an explanatory drawing showing a main part of a standby state maintaining device according to Embodiment 3 of the present invention.

FIG. 8 is an explanatory drawing showing a main part of a standby state maintaining device according to Embodiment 3 of the present invention. By referring to FIG. 8, the standby state maintaining device 100b of Embodiment 3 will be explained. The same components as those of the standby state maintaining device 100 of Embodiment 1 shown in FIG. 1 are denoted by the same reference numerals, and an explanation of the components will be omitted hereafter. Further, because the hardware configuration of an information processing unit 11 is the same as that explained by reference to FIG. 2 in Embodiment 1, an illustration and an explanation of the hardware configuration will be omitted hereafter.

The vehicle-mounted information apparatus 4 has a GPS (Global Positioning System) receiver 51. The GPS receiver 51 receives GPS signals transmitted by not-illustrated GPS satellites by using a GPS antenna 7.

In Embodiment 3, an information processing unit 11 implements the functions of car navigation. More specifically, the information processing unit 11 has a function of calculating the position of a vehicle 1 by using GPS signals received by the GPS receiver 51. When a starting switch 3 is switched off, the information processing unit 11 determines the type of a facility corresponding to the position of the vehicle 1 by using map data stored in a second memory 33. The information processing unit 11 outputs information (referred to as "facility information" hereafter) showing the determined facility type to a microcomputer 20b.

The microcomputer 20b has the same first and second operation modes as those of the microcomputer 20a according to Embodiment 2. The microcomputer 20b acquires the facility information from the information processing unit 11 when the starting switch 3 is switched off. The microcomputer 20b selectively performs either the first operation mode or the second operation mode in accordance with the facility type shown by the facility information. Concretely, for example, when the facility shown by the facility information is a parking lot of a gas station or store, the microcomputer 20b performs the second operation mode; otherwise, the microcomputer performs the first operation mode.

Further, in a state in which the starting switch 3 is on, the microcomputer 20b sets an electric connection in a switching circuit 16 between a vehicle battery 2 and a power supply unit 12 to an on state, like the microcomputers 20 and 20a according to Embodiments 1 and 2. As a result, the power supply unit 12 supplies power to the information processing unit 11 by using power supplied from the vehicle battery 2.

Further, in the state in which the starting switch 3 is on, the microcomputer 20b sets an electric connection in the switching circuit 16 between the vehicle battery 2, and a secondary battery 13 and a charge storage member 15 to an on state, and also instructs a charge and discharge control circuit 17 to charge the secondary battery 13, like the microcomputers 20 and 20a according to Embodiments 1 and 2. As a result, the secondary battery 13 is charged.

Further, in the state in which the starting switch 3 is on, the microcomputer 20b sets an electric connection in the switching circuit 16 between the vehicle battery 2, and the secondary battery 13 and the charge storage member 15 to the on state, and also sets a second switching element 19 to an on state, like the microcomputers 20 and 20a according to Embodiments 1 and 2. As a result, the charge storage member 15 is charged.

A control unit 21b is comprised of the switching circuit 16, the charge and discharge control circuit 17, a first switching element 18, the second switching element 19, and the microcomputer 20b. The standby state maintaining device 100b is comprised of the secondary battery 13, a temperature sensor 14, the charge storage member 15, and the control unit 21b.

Figure 9:
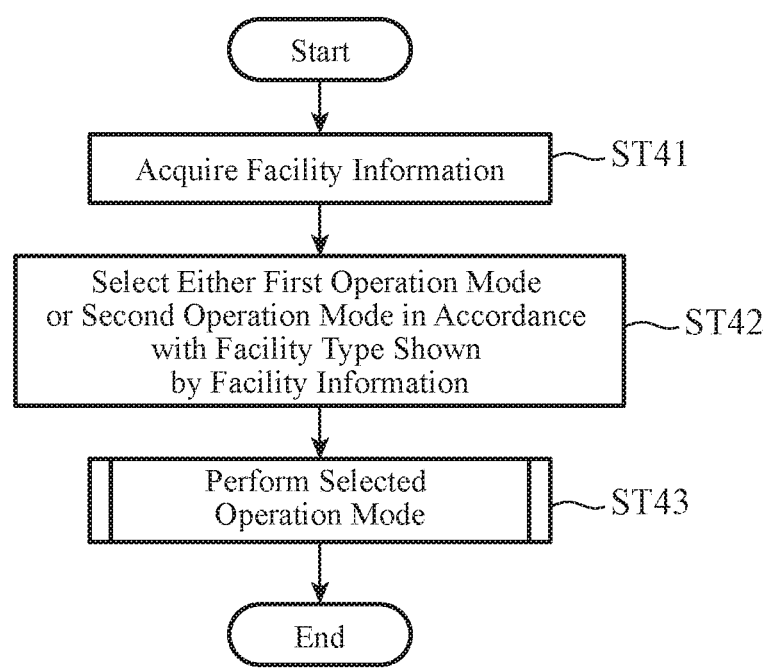
FIG. 9 is a flowchart showing an operation of the standby state maintaining device according to Embodiment 3 of the present invention.

Next, operations of the standby state maintaining device 100b will be explained by reference to a flowchart of FIG. 9, focusing on operations in the first operation mode and in the second operation mode which are performed by the microcomputer 20b. In an initial state, the starting switch 3 is in the on state, the power supply unit 12 supplies power to the information processing unit 11 by using the power supplied from the vehicle battery 2, and the information processing unit 11 is in an operating state. Further, the secondary battery 13 is in a state in which a charge is completed, and the charge storage member 15 is in a state in which a charge is completed. When the starting switch 3 is switched from the on state to the off state, the microcomputer 20b starts a process of step ST41.

First, the microcomputer 20b, in step ST41, acquires the facility information from the information processing unit 11. This facility information shows the type of a facility corresponding to the position of the vehicle 1 at the time that the starting switch 3 is switched off.

Then, the microcomputer 20b, in step ST42, selects either the first operation mode or the second operation mode in accordance with the facility type shown by the facility information acquired in step ST41. Concretely, for example, when the facility shown by the facility information is a parking lot of a gas station or store, the microcomputer 20b selects the second operation mode; otherwise, the microcomputer selects the first operation mode.

Then, the microcomputer 20b, in step ST43, performs the operation mode selected in step ST42.

When the vehicle 1 is parked or stopped in a parking lot of a gas station or store, there is a high probability that the parking or stopping will be ended in a short time. In such short-time parking or stopping, there is a high probability that a power saving standby state can be maintained using the electric charge stored in the charge storage member 15 until the starting switch 3 is switched on again.

Therefore, the standby state maintaining device 100b of Embodiment 3 performs the second operation mode to maintain the power saving standby state of the information processing unit 11 by using the vehicle battery 2 when a facility corresponding to the position of the vehicle 1 at the time that the starting switch 3 is switched off is a parking lot of a gas station or store. As a result, in short-time parking or stopping, the secondary battery 13 can be prevented from being discharged. As a result, the number of times of the charge and discharge of the secondary battery 13 can be reduced, and the life of the secondary battery 13 can be further increased.

The criterion for the selection in step ST42 is not limited to whether or not the facility shown by the facility information is a parking lot of a gas station or store. The standby state maintaining device 100b should just select the second operation mode when the facility information shows a facility having a high probability that the parking or stopping will be ended in a short time, or select the first operation mode otherwise.

Further, the standby state maintaining device 100b of Embodiment 3 can adopt various variants which are the same as those explained in Embodiment 1. For example, a part of the processing in the first operation mode can be performed by a CPU in the charge and discharge control circuit 17, like in the case of the example shown in FIG. 4. As an alternative, for example, the secondary battery 13, the temperature sensor 14 can be disposed outside the vehicle-mounted information apparatus 4, like in the case of the example shown in FIG. 5.

As mentioned above, in the standby state maintaining device 100b of Embodiment 3, the control unit 21b has the second operation mode of, in the state in which the starting switch 3 is off, maintaining the power saving standby state by using the charge storage member 15. By performing the second operation mode, the number of times of the charge and discharge of the secondary battery 13 can be reduced, and the life of the secondary battery 13 can be further increased.

Further, the control unit 21b acquires information showing the type of a facility corresponding to the position of the vehicle 1 when the starting switch 3 is switched off (step ST41), and selectively performs either the first operation mode or the second operation mode in accordance with the facility type (steps ST42 and ST43). As a result, in short-time parking or stopping, the secondary battery 13 can be prevented from being discharged. As a result, the number of times of the charge and discharge of the secondary battery 13 can be reduced, and the life of the secondary battery 13 can be further increased.

Embodiment 4

Figure 10:
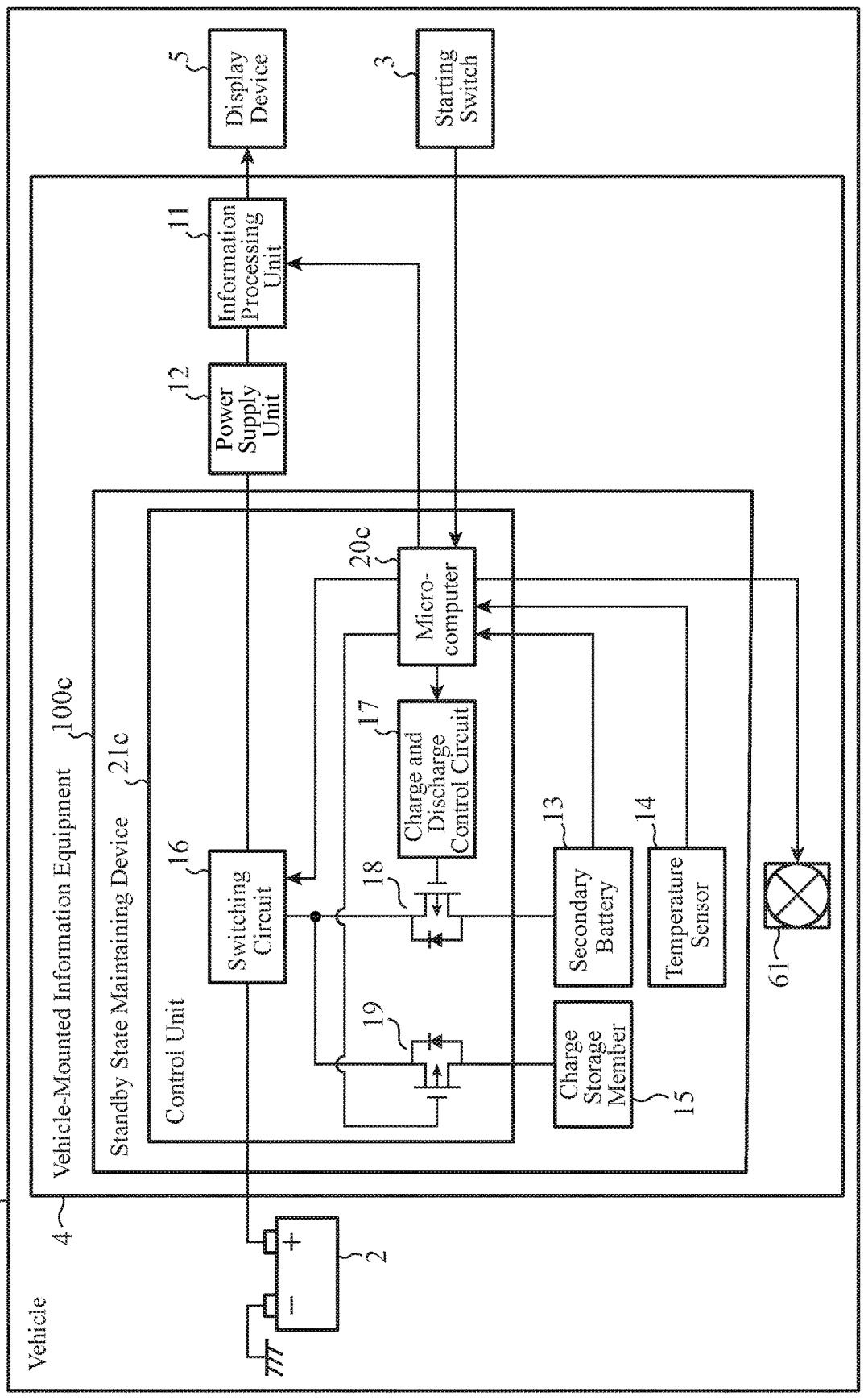
FIG. 10 is an explanatory drawing showing a main part of a standby state maintaining device according to Embodiment 4 of the present invention.

FIG. 10 is an explanatory drawing showing a main part of a standby state maintaining device according to Embodiment 4 of the present invention. By referring to FIG. 10, the standby state maintaining device 100c of Embodiment 4 will be explained. The same components as those of the standby state maintaining device 100 of Embodiment 1 shown in FIG. 1 are denoted by the same reference numerals, and an explanation of the components will be omitted hereafter. Further, because the hardware configuration of an information processing unit 11 is the same as that explained by reference to FIG. 2 in Embodiment 1, an illustration and an explanation of the hardware configuration will be omitted hereafter.

A microcomputer 20c causes a cooling device 61 for a secondary battery 13 to operate in a state in which a starting switch 3 is off. The cooling device 61 is comprised of, for example, a cooling fan disposed in the vehicle-mounted information apparatus 4. More concretely, the microcomputer 20c causes the cooling device 61 to operate at a timing shown in one of the following three concrete examples.

The first concrete example is one in which the cooling device 61 is caused to operate until a detected value provided by a temperature sensor 14 falls within a reference range after the starting switch 3 has been switched off. In this case, the microcomputer 20c has the same first and second operation modes as those of the microcomputers 20a and 20b according to Embodiments 2 and 3. The microcomputer 20c performs the second operation mode until the detected value provided by the temperature sensor 14 falls within the reference range after the starting switch 3 has been switched off, and then performs the first operation mode.

The second concrete example is one in which the cooling device 61 is caused to operate until a predetermined time (referred to as a "third reference time" hereafter, e.g., 30 minutes) elapses since the starting switch 3 has been switched off. In this case, the microcomputer 20c has the same first and second operation modes as those of the microcomputers 20a and 20b according to Embodiments 2 and 3. The microcomputer 20c performs the second operation mode until the third reference time elapses since the starting switch 3 has been switched off, and then performs the first operation mode.

The third concrete example is one in which the cooling device 61 is caused to operate when the detected value provided by the temperature sensor 14 is greater than a first threshold in the first operation mode. In this case, the microcomputer 20c has the same first operation mode as that of the microcomputer 20 according to Embodiment 1. The microcomputer 20c starts the operation in the first operation mode when the starting switch 3 is switched off.

Further, in a state in which the starting switch 3 is on, the microcomputer 20c sets an electric connection in a switching circuit 16 between a vehicle battery 2 and a power supply unit 12 to an on state, like the microcomputers 20, 20a, and 20b according to Embodiments 1 to 3. As a result, the power supply unit 12 supplies power to the information processing unit 11 by using power supplied from the vehicle battery 2.

Further, in the state in which the starting switch 3 is on, the microcomputer 20c sets an electric connection in the switching circuit 16 between the vehicle battery 2 and a secondary battery 13 and a charge storage member 15 to an on state, and also instructs a charge and discharge control circuit 17 to charge the secondary battery 13, like the microcomputers 20, 20a, and 20b according to Embodiments 1 to 3. As a result, the secondary battery 13 is charged.

Further, in the state in which the starting switch 3 is on, the microcomputer 20c sets an electric connection in the switching circuit 16 between the vehicle battery 2, and the secondary battery 13 and the charge storage member 15 to the on state, and also sets a second switching element 19 to an on state, like the microcomputers 20, 20a, and 20b according to Embodiments 1 to 3. As a result, the charge storage member 15 is charged.

A control unit 21c is comprised of the switching circuit 16, the charge and discharge control circuit 17, a first switching element 18, the second switching element 19, and the microcomputer 20c. The standby state maintaining device 100c is comprised of the secondary battery 13, the temperature sensor 14, the charge storage member 15, and the control unit 21c.

Figure 11:
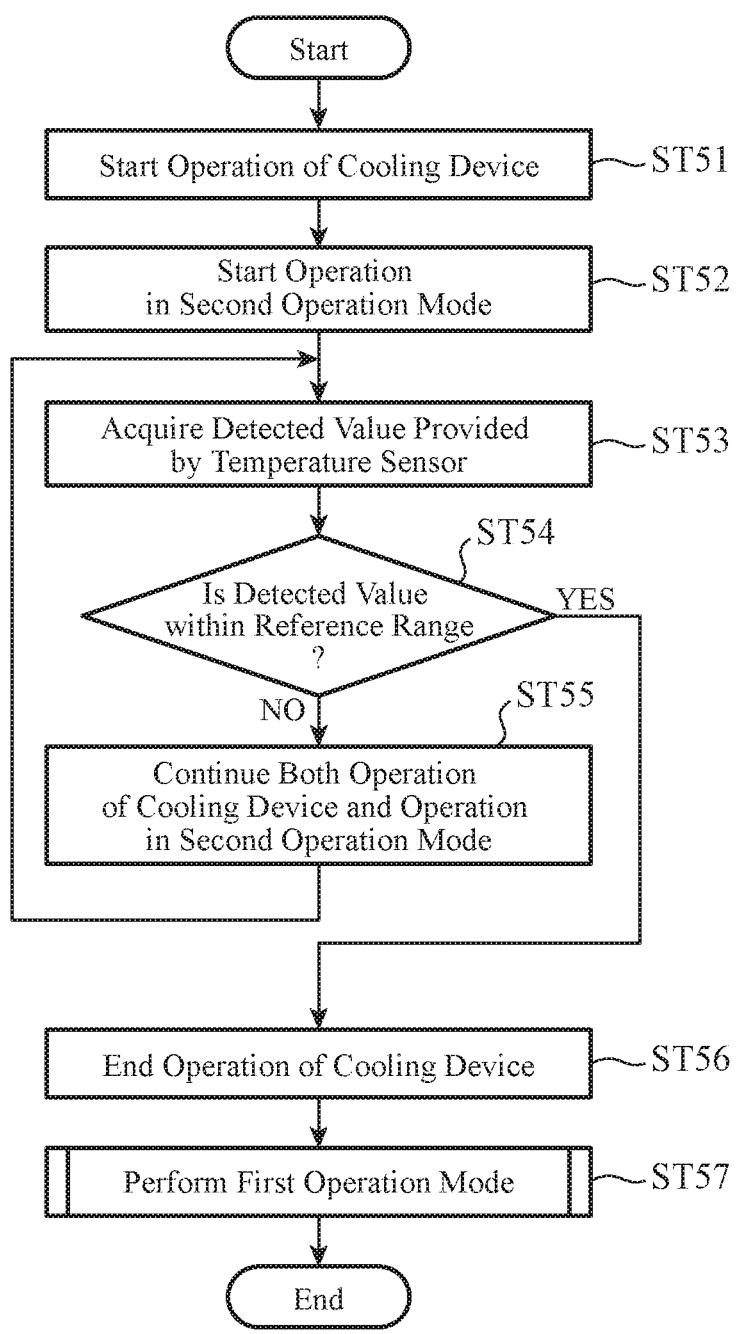
FIG. 11 is a flowchart showing an operation of the standby state maintaining device according to Embodiment 4 of the present invention.

Next, operations of the standby state maintaining device 100c will be explained by reference to a flowchart of FIG. 11, focusing on an operation of the microcomputer 20c in the above-mentioned first concrete example. In an initial state, the starting switch 3 is in the on state, the power supply unit 12 supplies power to the information processing unit 11 by using the power supplied from the vehicle battery 2, and the information processing unit 11 is in an operating state. Further, the secondary battery 13 is in a state in which a charge is completed, and the charge storage member 15 is in a state in which a charge is completed.

More specifically, the electric connection in the switching circuit 16 between the vehicle battery 2 and the power supply unit 12 is in the on state, the electric connection between the secondary battery 13 and the charge storage member 15, and the power supply unit 12 is in the off state, and the electric connection between the vehicle battery 2, and the secondary battery 13 and the charge storage member 15 is in the off state. Further, the first switching element 18 is in the off state, and the second switching element 19 is in the off state. When the starting switch 3 is switched from the on state to the off state, the microcomputer 20c starts a process of step ST51.

First, the microcomputer 20c, in step ST51, starts the operation of the cooling device 61.

Then, the microcomputer 20c, in step ST52, starts the operation in the second operation mode. More specifically, the microcomputer 20c switches the electric connection in the switching circuit 16 between the vehicle battery 2 and the power supply unit 12 from the on state to the off state, and also switches the electric connection between the secondary battery 13 and the charge storage member 15, and the power supply unit 12 from the off state to the on state. Further, the microcomputer 20c switches the second switching element 19 from the off state to the on state. In addition, the microcomputer 20c instructs the information processing unit 11 to switch from the operating state to a power saving standby state.

Then, the microcomputer 20c, in step ST53, acquires the detected value provided by the temperature sensor 14 from the temperature sensor 14. Then, the microcomputer 20c, in step ST54, determines whether or not the detected value acquired in step ST53 is within the reference range.

When the detected value acquired in step ST53 is outside the reference range ("NO" in step ST54), the microcomputer 20c returns to the process of step ST53 while causing the cooling device 61 to continue operating, and continuing the operation in the second operation mode (step ST55).

In contrast, when the detected value acquired in step ST53 is within the reference range ("YES" in step ST54), the microcomputer 20c ends the operation of the cooling device 61 (step ST56) and performs the first operation mode (step ST57). Concretely, for example, the microcomputer 20c advances to the process of step ST23 shown in FIG. 3C.

Figure 12:
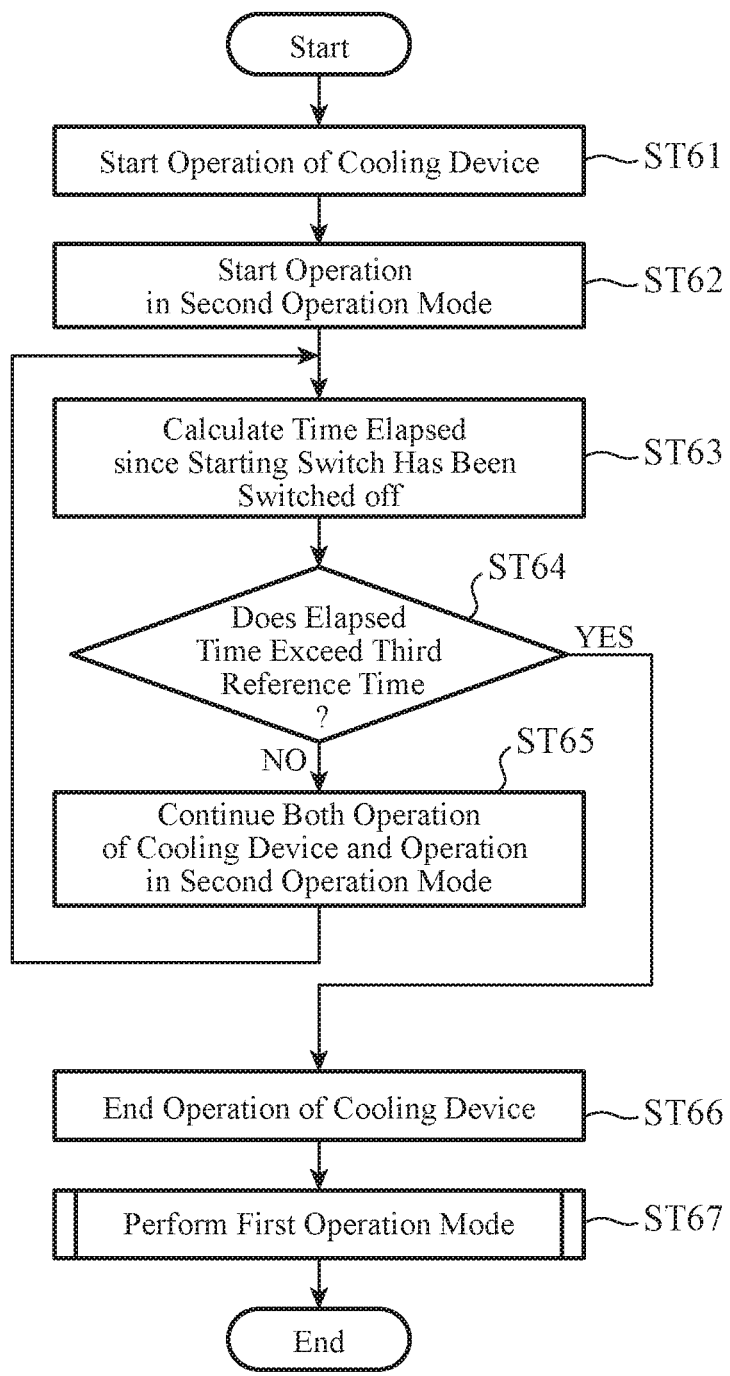
FIG. 12 is a flowchart showing another operation of the standby state maintaining device according to Embodiment 4 of the present invention.

Next, operations of the standby state maintaining device 100c will be explained by reference to a flowchart of FIG. 12, focusing on an operation of the microcomputer 20c in the above-mentioned second concrete example. In an initial state, the starting switch 3 is in the on state, the power supply unit 12 supplies power to the information processing unit 11 by using the power supplied from the vehicle battery 2, and the information processing unit 11 is in the operating state. Further, the secondary battery 13 is in a state in which a charge is completed, and the charge storage member 15 is in a state in which a charge is completed.

More specifically, the electric connection in the switching circuit 16 between the vehicle battery 2 and the power supply unit 12 is in the on state, the electric connection between the secondary battery 13 and the charge storage member 15, and the power supply unit 12 is in the off state, and the electric connection between the vehicle battery 2, and the secondary battery 13 and the charge storage member 15 is in the off state. Further, the first switching element 18 is in the off state, and the second switching element 19 is in the off state. When the starting switch 3 is switched from the on state to the off state, the microcomputer 20c starts a process of step ST61.

First, the microcomputer 20c, in step ST61, starts the operation of the cooling device 61.

Then, the microcomputer 20c, in step ST62, starts the operation in the second operation mode. More specifically, the microcomputer 20c switches the electric connection in the switching circuit 16 between the vehicle battery 2 and the power supply unit 12 from the on state to the off state, and also switches the electric connection between the secondary battery 13 and the charge storage member 15, and the power supply unit 12 from the off state to the on state. Further, the microcomputer 20c switches the second switching element 19 from the off state to the on state. In addition, the microcomputer 20c instructs the information processing unit 11 to switch from the operating state to the power saving standby state.

Then, the microcomputer 20c, in step ST63, calculates the time which has elapsed since the starting switch 3 has been switched off. Then, the microcomputer 20c, in step ST64, compares the elapsed time calculated in step ST63 with the third reference time.

When the elapsed time calculated in step ST63 is equal to or less than the third reference time ("NO" in step ST64), the microcomputer 20c returns to the process of step ST63 while causing the cooling device 61 to continue operating, and continuing the operation in the second operation mode (step ST65).

In contrast, when the elapsed time calculated in step ST63 exceeds the third reference time ("YES" in step ST64), the microcomputer 20c ends the operation of the cooling device 61 (step ST66), and performs the first operation mode (step ST67). Concretely, for example, the microcomputer 20c advances to the process of step ST23 shown in FIG. 3C.

Figure 13:
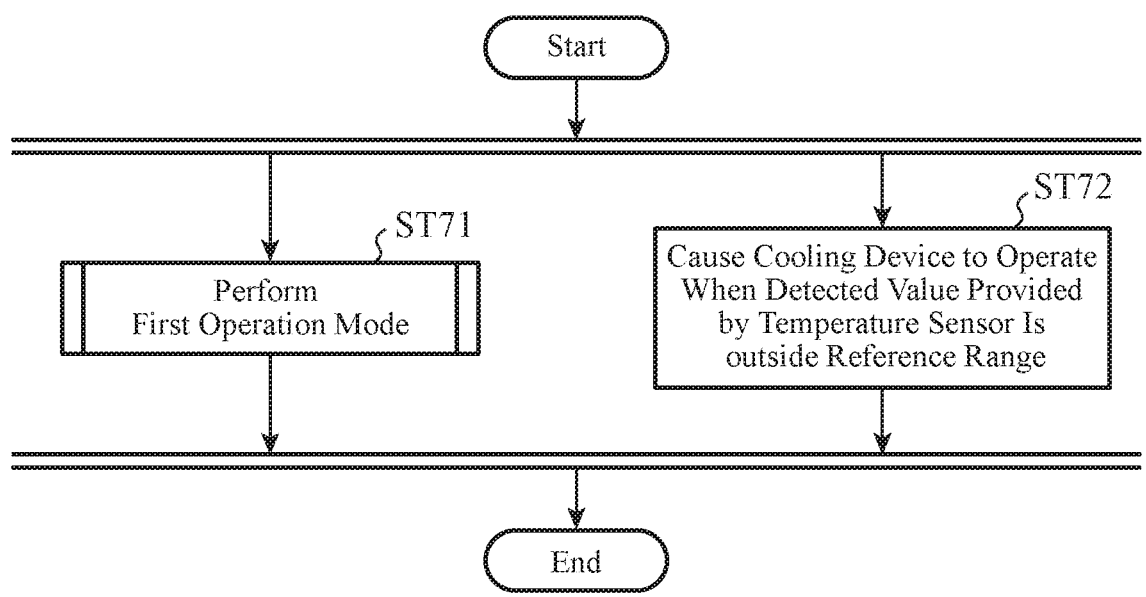
FIG. 13 is a flowchart showing another operation of the standby state maintaining device according to Embodiment 4 of the present invention.

Next, operations of the standby state maintaining device 100c will be explained by reference to a flowchart of FIG. 13, focusing on an operation of the microcomputer 20c in the above-mentioned third concrete example. In an initial state, the starting switch 3 is in the on state, the power supply unit 12 supplies power to the information processing unit 11 by using the power supplied from the vehicle battery 2, and the information processing unit 11 is in the operating state. Further, the secondary battery 13 is in a state in which a charge is completed, and the charge storage member 15 is in a state in which a charge is completed. When the starting switch 3 is switched from the on state to the off state, the microcomputer 20c starts a process of step ST71.

The microcomputer 20c, in step ST71, performs the first operation mode. More specifically, the microcomputer 20c performs the processing shown in FIG. 3.

Further, in the background of step ST71, the microcomputer 20c performs a process of causing the cooling device 61 to operate when the detected value provided by the temperature sensor 14 is greater than the first threshold (step ST72). Concretely, for example, when determining "NO" in step ST2, "NO" in step ST12, or "NO" in step ST24 during the process of step ST71, the microcomputer 20c starts the operation of the cooling device 61. After that, when determining "YES" in step ST12 or "YES" in step ST24 during the process of step ST71 or when the operation in the first operation mode is ended, the microcomputer 20c ends the operation of the cooling device 61.

Usually, the temperature of the main body of the secondary battery 13 and the ambient temperature of the secondary battery are the highest immediately after the starting switch 3 is switched off, and, after that, gradually decrease with time. Therefore, there is a high probability that the detected value provided by the temperature sensor 14 is greater than the first threshold immediately after the starting switch 3 is switched off.

In contrast, the standby state maintaining device 100c in the above-mentioned first or second concrete example maintains the power saving standby state by using the charge storage member 15 (second operation mode) while cooling the secondary battery 13, immediately after the starting switch 3 is switched off, and shifts to the first operation mode after the cooling is ended. Further, the standby state maintaining device 100c in the above-mentioned third concrete example cools the secondary battery 13 while performing the first operation mode. By virtue of these cooling operations, the occurrence of a situation in which the first operation mode ends without using the secondary battery 13 for maintaining the power saving standby state can be suppressed while the secondary battery 13 is prevented from being discharged in a high temperature environment.

In the above-mentioned second concrete example, the value of the third reference time is not limited 30 minutes. The third reference time can be set to a time making it possible to maintain the power saving standby state by using the charge storage member 15, in accordance with the capacity of the charge storage member 15, the magnitude of the dark current consumed by the information processing unit 11. Further, the third reference time can be the same as the first reference time, or can be different from the first reference time.

Further, the timing at which the microcomputer 20c causes the cooling device 61 to operate is not limited to the timing explained in any of the above-mentioned first through third concrete examples. The microcomputer 20c can cause the cooling device 61 to operate at any timing as long as the starting switch 3 is in the off state. However, from the viewpoint of avoiding useless cooling, it is more preferable that the cooling device 61 is caused to operate at a timing that there is a high probability that the detected value provided by the temperature sensor 14 is greater than the first threshold, such as a timing immediately after the starting switch 3 is switched off.

Further, the standby state maintaining device 100c of Embodiment 4 can adopt various variants which are the same as those explained in Embodiment 1. For example, a part of the processing in the first operation mode can be performed by a CPU in the charge and discharge control circuit 17, like in the case of the example shown in FIG. 4. As an alternative, for example, the secondary battery 13, the temperature sensor 14 can be disposed outside the vehicle-mounted information apparatus 4, like in the case of the example shown in FIG. 5. In this case, the cooling device 61 can be comprised of, for example, a cooling fan disposed in a secondary battery module 6.

As mentioned above, in the standby state maintaining device 100c of Embodiment 4, the control unit 21c causes the cooling device 61 for the secondary battery 13 to operate in the state in which the starting switch 3 is off. By virtue of the cooling using the cooling device 61, the occurrence of a situation in which the first operation mode ends without using the secondary battery 13 for maintaining the power saving standby state can be suppressed.

Further, the control unit 21c causes the cooling device 61 for the secondary battery 13 to operate until the detected value falls within the reference range after the starting switch 3 has been switched off, and then performs the first operation mode. As a result, the cooling device 61 can be caused to operate at a timing that the temperature of the main body of the secondary battery 13 and the ambient temperature of the secondary battery are high.

Further, the control unit 21c maintains the power saving standby state by using the charge storage member 15 until the detected value falls within the reference range after the starting switch 3 has been switched off. As a result, the power saving standby state can be maintained also during the cooling, and the secondary battery 13 can be prevented from being discharged before the cooling is completed.

As an alternative, the control unit 21c causes the cooling device 61 for the secondary battery 13 to operate until the third reference time elapses since the starting switch 3 has been switched off, and then performs the first operation mode. As a result, the cooling device 61 can be caused to operate at a timing that the temperature of the main body of the secondary battery 13 and the ambient temperature of the secondary battery are high.

Further, the control unit 21c maintains the power saving standby state by using the charge storage member 15 until the third reference time elapses since the starting switch 3 has been switched off. As a result, the power saving standby state can be maintained also during the cooling, and the secondary battery 13 can be prevented from being discharged before the cooling is completed.

As an alternative, when the detected value is greater than the first threshold in the first operation mode, the control unit 21c causes the cooling device 61 for the secondary battery 13 to operate. As a result, the cooling device 61 can be caused to operate at a timing that the temperature of the main body of the secondary battery 13 and the ambient temperature of the secondary battery are high.

It is to be understood that any combination of two or more of the above-mentioned embodiments can be made, various changes can be made in any component according to any one of the above-mentioned embodiments, and any component according to any one of the above-mentioned embodiments can be omitted within the scope of the invention.

INDUSTRIAL APPLICABILITY

The standby state maintaining device of the present invention can be used for maintaining a power saving standby state in the vehicle-mounted information apparatus.

REFERENCE SIGNS LIST 1 vehicle, 2 vehicle battery, 3 starting switch, 4 vehicle-mounted information device, 5 display device, 6 secondary battery module, 7 GPS antenna, 11 information processing unit, 12 power supply unit, 13 secondary battery, 14 temperature sensor, 15 charge storage member, 16 switching circuit, 17 charge and discharge control circuit, 18 first switching element, 19 second switching element, 20, 20a, 20b, 20c microcontroller (microcomputer), 21, 21a, 21b, 21c control unit, 31 processor, 32 first memory, 33 second memory, 41 CPU, 51 GPS receiver, 61 cooling device, and 100, 100a, 100b, 100c standby state maintaining device.

The invention claimed is:

1. A standby state maintaining device comprising:
   a secondary battery provided separately from a vehicle battery;
   a temperature sensor for the secondary battery;
   a charge storage member that is charged and discharged in a temperature outside a reference range; and
   a controller having a first operation mode of, in a state in which a starting switch of a vehicle is off, maintaining a power saving standby state of a vehicle-mounted information apparatus by using the secondary battery when a detected value corresponding to a temperature of the secondary battery provided by the temperature sensor is within the reference range, and maintaining the power saving standby state by using the charge storage member when the detected value provided by the temperature sensor is outside the reference range.

2. The standby state maintaining device according to claim 1, wherein when the detected value falls outside the reference range while the power saving standby state is maintained using the secondary battery in the first operation mode, the controller switches a state of the vehicle-mounted information apparatus from the power saving standby state using the secondary battery to the power saving standby state using the charge storage member.

3. The standby state maintaining device according to claim 1, wherein when a charge capacity of the secondary battery becomes less than a reference capacity while the power saving standby state is maintained using the secondary battery in the first operation mode, the controller ends the power saving standby state.

4. The standby state maintaining device according to claim 1, wherein when the detected value falls within the reference range while the power saving standby state is maintained using the charge storage member in the first operation mode, the controller switches a state of the vehicle-mounted information apparatus from the power saving standby state using the charge storage member to the power saving standby state using the secondary battery.

5. The standby state maintaining device according to claim 1, wherein when a duration of the power saving standby state using the charge storage member exceeds a first reference time while the power saving standby state is maintained using the charge storage member in the first operation mode, the controller ends the power saving standby, state.

6. The standby state maintaining device according to claim 1, wherein the reference range is set up as either a range including values equal to or less than a first threshold corresponding to an upper limit, or a range including values equal to or greater than a second threshold corresponding to a lower limit and equal to or less than the first threshold.

7. The standby state maintaining device according to claim 6, wherein when the detected value is greater than the first threshold in the first operation mode, the controller causes a cooling device for the secondary battery to operate.

8. The standby state maintaining device according to claim 1, wherein the controller has a second operation mode of, in the state in which the starting switch is off, maintaining the power saving standby state by using the charge storage member.

9. The standby state maintaining device according to claim 8, wherein the controller performs the second operation mode until a second reference time elapses since the starting switch has been switched off, and performs the first operation mode after the second reference time elapses.

10. The standby state maintaining device according to claim 8, wherein the controller acquires information showing a type of a facility corresponding to a position of the vehicle when the starting switch is switched off, and selectively performs either the first operation mode or the second operation mode in accordance with the type of the facility.

11. The standby state maintaining device according to claim 1, wherein the controller causes a cooling device for the secondary battery to operate in the state in which the starting switch is off.

12. The standby state maintaining device according to claim 1, wherein the controller causes a cooling device for the secondary battery to operate until the detected value falls within the reference range after the starting switch has been switched off, and then performs the first operation mode.

13. The standby state maintaining device according to claim 12, wherein the controller maintains the power saving standby state by using the vehicle battery until the detected value falls within the reference range after the starting switch has been switched off.

14. The standby state maintaining device according to claim 1, wherein the controller causes a cooling device for the secondary battery to operate until a third reference time elapses since the starting switch has been switched off, and then performs the first operation mode.

15. The standby state maintaining device according to claim 14, wherein the controller maintains the power saving standby state by using the vehicle battery until the third reference time elapses since the starting switch has been switched off.

16. The standby state maintaining device according to claim 1, wherein the secondary battery comprises either a lithium ion battery or a nickel-metal hydride battery.

17. The standby state maintaining device according to claim 1, wherein the charge storage member comprises a super capacitor.

\* \* \* \* \*